(12) United States Patent
Badano et al.

(10) Patent No.: US 9,705,015 B2
(45) Date of Patent: Jul. 11, 2017

(54) COMPONENT FOR THE DETECTION OF ELECTROMAGNETIC RADIATION IN A RANGE OF WAVELENGTHS AND METHOD FOR MANUFACTURING SUCH A COMPONENT

(71) Applicant: Commissariat a L'Energie Atomique et aux Energies Alternatives, Paris (FR)

(72) Inventors: Giacomo Badano, Lans en Vercors (FR); Emeline Lesmanne, Fontaine (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/252,407

(22) Filed: Aug. 31, 2016

(65) Prior Publication Data

US 2017/0069768 A1   Mar. 9, 2017

(30) Foreign Application Priority Data

Sep. 3, 2015  (FR) .................................... 15 01823
Jun. 16, 2016  (FR) .................................... 16 00966

(51) Int. Cl.
*H01L 31/0232*   (2014.01)
*G01J 5/08*   (2006.01)
(Continued)

(52) U.S. Cl.
CPC ........ *H01L 31/02325* (2013.01); *G01J 5/024* (2013.01); *G01J 5/0862* (2013.01); *H01L 31/18* (2013.01)

(58) Field of Classification Search
CPC ........... H01L 31/0232; H01L 31/02325; H01L 31/02327; H01L 1/18; G01J 5/0014;
(Continued)

(56) References Cited

U.S. PATENT DOCUMENTS 7,427,742 B2 * 9/2008 Drowley .................. G06T 9/00
250/208.1
2006/0175551 A1   8/2006 Fan et al.
(Continued)

FOREIGN PATENT DOCUMENTS

WO   WO 2008/014983 A1   2/2008
WO   WO 2014/100706 A1   6/2014

OTHER PUBLICATIONS

French Preliminary Search Report issued May 25, 2016 in French Application 15 01823, filed Sep. 3, 2015 (with English Translation of Categories of Cited Documents).
(Continued)

*Primary Examiner* — Thanh Y Tran
(74) *Attorney, Agent, or Firm* — Oblon, McClelland, Maier & Neustadt, L.L.P.

(57) ABSTRACT

A component intended for the detecting and/or the measuring of an electromagnetic radiation in a first range of wavelengths. The component includes a support including at least one first structure and a reception face in order to receive the electromagnetic radiation; an optical filter of the band-pass type in the first range of wavelengths arranged on the reception face of the support. The optical filter includes an adaptation zone covering the reception face of the support and with a refractive index less than 2; a first metal layer covering the adaptation zone and including regularly distributed through-holes. Each one of the through-holes contains a filling material.

16 Claims, 16 Drawing Sheets

(51) Int. Cl.
*G01J 5/02* (2006.01)
*H01L 31/18* (2006.01)

(58) Field of Classification Search
CPC .. G01J 5/024; G01J 5/08; G01J 5/0803; G01J 5/0831; G01J 5/0862; G01J 5/20; G01J 5/085; G01J 5/0856
See application file for complete search history.

(56) References Cited

U.S. PATENT DOCUMENTS

2012/0235038 A1* 9/2012 Nishikawa ............ G01J 5/0014
  250/338.3
2015/0369668 A1* 12/2015 Watabe .................. H01L 37/02
  250/338.3
2016/0225923 A1 8/2016 Badano et al.

OTHER PUBLICATIONS

Ryan T. Kristensen et al. "Frequency Selective Surfaces as Near-Infrared Electromagnetic Filters for Thermophotovoltaic Spectral Control", Journal of Applied Physics, vol. 95, No. 9, May 1, 2004, 8 pages.

* cited by examiner

COMPONENT FOR THE DETECTION OF ELECTROMAGNETIC RADIATION IN A RANGE OF WAVELENGTHS AND METHOD FOR MANUFACTURING SUCH A COMPONENT

TECHNICAL FIELD

The invention relates to the field of detecting electromagnetic radiation in the infrared and visible range and more precisely has for object a component intended to detect electromagnetic radiation in a first range of wavelengths included in the infrared and visible range and the method of manufacturing such a component.

In certain applications of the invention, the invention also has for object a component intended to allow for the detection of electromagnetic radiation in at least two ranges of wavelengths comprised in the infrared and visible range.

PRIOR ART

For certain imaging or spectroscopy applications in the infrared and visible range, it is necessary to be able to detect and/or measure only the electromagnetic radiation of which the wavelengths are comprised in a predefined range of wavelengths.

It is in order to respond to these needs that optical filters of the band-pass type were developed. These filters of the band-pass type can indeed be associated with structures able to absorb electromagnetic radiation. As such, such an optical filter makes it possible to transmit to these structures mostly the portion of the electromagnetic radiation that is located in a well-defined range of wavelengths. It is therefore mostly this portion of the electromagnetic radiation that will be detected by these structures.

The term band-pass filter in a range of wavelengths means hereinabove and in the rest of this document that such a filter receiving electromagnetic radiation of which a portion of the spectrum is comprised in the range of wavelengths transmits mostly said portion, with the rest of the spectrum being at least partially reflected and/or absorbed.

Such band-pass filters are based on the frequency selective surfaces already used for radiofrequencies.

The works of Kristensen and of his colleagues published in the scientific review Journal of Applied Physics volume 95 pages 4845 in 2004, show such an application of the frequency selective surfaces in order to form a band-pass filter in a range of wavelengths comprised in the infrared range.

It must be understood, hereinabove, and in the rest of this document, by frequency selective surface, an optically opaque metal layer except in correspondence with identical through-holes, with the dimensioning of the through-holes of said frequency selective surface being adapted so that each one of the holes has an effective section of maximum transmission in a given range of wavelengths and substantially zero outside of it. The transmission of such a frequency selective surface in a given range of wavelengths therefore results from the sum of the transmissions of each one of the through-holes. As such if in a conventional configuration the through-holes participating in the formation of a frequency selective surface are regularly distributed over the metal surface, such a frequency selective surface can also be formed using through-holes that have a random distribution in the metal layer.

Such an optical filter, arranged on a silicon substrate that can integrate one or several semiconductor structures, comprises:
- a first layer of silica covering the substrate,
- an aluminium metal layer covering the first layer of silica and comprising through-holes distributed and dimensioned in order to form a frequency selective surface,
- a second layer of silica covering the metal layer.

The through-holes of the metal layer are also filled with silica.

This type of filter, in the same way as a frequency selective surface in the frequency range of radiofrequencies, makes it possible to provide a band-pass filter in a range of wavelengths comprised in the infrared range. As such, such an optical filter makes it possible, by associating it with one to several absorbing structures, to form a component in order to detect and/or measure a radiation in a given range of wavelengths.

This type of filter described by Kristensen and his colleagues however has a certain number of disadvantages. With such an optical filter the average size of the patterns and therefore their period are close to the wavelength of the light to be filtered. However the first diffraction order appears at a wavelength equal to the period. It as such results from this period, and from the diffraction that such a period causes, the appearance of a parasite peak and an excitation of the photon guiding in the silica. This has for consequence a transmission template with such a non-optimal optical filter, with the transmission peak of the optical filter being highly asymmetric, and a degraded rejection.

DESCRIPTION OF THE INVENTION

This invention aims to overcome several of these disadvantages and therefore more precisely has for object the supply of a component intended for the detection and/or the measuring of an electromagnetic radiation in a first range of wavelengths included in the infrared and visible range of which the optical filter can itself have an optimised transmission rate in relation to the optical filter of a component of prior art.

The invention to this effect relates to a component intended for the detection and/or the measuring of an electromagnetic radiation in a first range of wavelengths included in the infrared and visible range, the component comprising:
- a support comprising a reception face in order to receive the electromagnetic radiation and at least one first structure able to absorb an electromagnetic radiation,
- an optical filter of which at least one first portion associated with the first structure is of the band-pass filter type in the first range of wavelengths, the optical filter being arranged on the reception face of the support in such a way as to filter the electromagnetic radiation transmitted to the support, with the optical filter comprising:
- an adaptation zone covering at least partially the reception face of the support, with the adaptation zone having a refractive index in the first range of wavelengths which is less than 2,
- a first metal layer covering the adaptation zone and comprising first through-holes distributed and dimensioned so that the metal layer forms a frequency selective surface.

Each one of the first through-holes contains a filling material of which the refractive index in the first range of wavelengths is greater than 2, A filling material of each one of the first and second through-holes having a strong refractive index in relation to that of the adaptation zone makes it possible to provide an optical filter with an improved rejection. This results for such an optical filter in a narrower transmission peak and with an improved symmetry with regards to an optical filter of prior art, such as described by Kristensen and his colleagues. The distance between the through-holes can therefore be less than the wavelengths of the first range of wavelengths.

As such with a possibility of arranging through-holes with a distance between the holes less than the wavelengths of the first range of wavelengths, it is possible to avoid the photonic guided modes in the optical filter that could reduce by as much the transmission rate. The optical filter of a component according to the invention can therefore itself have an optimised transmission rate in relation to an optical filter of a component of prior art.

The filling material of which the refractive index in the first range of wavelengths is preferably between 2 and 4, and more preferably between 2 and 3.

The first through-holes can be regularly distributed in the first metal layer.

In this way, the arrangement of the first holes in the first metal layer can easily be adapted in order to be suitable to the constraint of a component comprising a plurality of structures able to absorb electromagnetic radiation arranged in a matrix. Note in addition, that with a regular arrangement of the first holes in the first metal layer, it is easy to optimise the distance between the through-holes.

The adaptation zone can have a refractive index in the first range of wavelengths which is preferentially less than 1.7, even 1.5 or 1.2 and is ideally substantially equal to 1.

By "a first range of wavelengths comprised in the infrared and visible range", it must be understood hereinabove and in the rest of this document that the first range of wavelengths is comprised in a range of wavelengths that includes the visible and infrared wavelengths. As such the first range of wavelengths can be entirely included in the visible range as well as in the infrared range and even include a portion of its wavelengths comprised in the visible range and the rest of its wavelengths comprised in the infrared range.

In each one of the through-holes a spacing can be provided between the metal layer and the filling material.

In each one of the first through-holes, a spacing can be provided between the metal layer, said spacing being configured to have a refractive index in the first range of wavelengths less than 2, preferably 1.7, even 1.5, this either by containing an interface material having said refractive index, or by being devoid of material.

With such a spacing between the metal layer and the filling material it is possible to provide an interface zone having a refractive index less than 2, preferentially 1.5, either by leaving this spacing empty or by filling it with a suitable material. Such an interface zone is particularly advantageous. Indeed, it makes it possible as shown in FIGS. 4A and 4B to provide an optical filter with a transmission rate in the first range of wavelengths that is optimised.

The spacing can be configured to have a refractive index in the first range of wavelengths less than 2, preferably 1.7, even 1.5 by containing an interface material, with interface material also able to be positioned between the filling material and the adaptation zone.

The filling material can be encapsulated in the interface material in such a way that the interface material acts as an interface between the filling material and the layer of metal and is positioned between the filling material and the support.

The spacing can be configured to have a refractive index in the first range of wavelengths less than 2, preferably 1.7, even 1.5 by containing an interface material, with the interface material able to be selected from the group comprising silicon dioxides, silicon nitrides.

Such materials have refractive indexes in the visible and infrared ranges that are particularly low.

Each hole passing through the spacing between the metal layer and the filling material can be devoid of material.

Such a void of material is particularly advantageous in order to obtain a refractive index that is as low as possible and as such best optimise the rejection rate of the optical filter.

The adaptation zone can be formed by a second hollow space.

The optical filter can furthermore include:
a second metal layer, said second metal layer comprising second through-holes according to a configuration that is substantially identical to the first through-holes of the first metal layer, with these second through-holes also containing filling material,
the first and the second metal layer being separated from one another by a distance d by a first hollow space, with the distance d satisfying the following inequalities:

$$\frac{\lambda}{6} \leq d \leq \frac{\lambda}{3}.$$

The inventors discovered surprisingly that with the use of a hollow space dimensioned as such to separate the first and the second metal layer, the transmission of the optical filter is significantly greater than the multiplication of the transmission rates that would be obtained for a first and a second optical filter comprising respectively the first and the second metal layer. This result is linked, as discovered by the inventors, to a coupling between the resonances of each one of the metal layers. The rejection rate is as such optimised without the transmission rate being significantly affected.

The distance d separating one from the other the first and the second metal layer can be substantially equal to $$\frac{\lambda}{4}.$$

With such a configuration, the transmission rate in the first range of wavelengths is particularly optimised.

In each one of the first and second holes passing through the spacing between the metal layer and the filling material wherein an interface material can be included, said spacing containing an interface material having a refractive index in the first range of wavelengths less than 2, preferably 1.7, even 1.5.

Such an interface material makes it possible to provide a spacing between the metal layer and the interface material with a refractive index that is suitable for optimising the transmission rate in the first range of wavelengths that is optimised. In addition, contrary to a spacing left empty, which is therefore subjected to the varying changes in the atmosphere, the refractive index of such an interface material has the advantage of being stable over time.

The filling material can be a material selected in the group comprising silicon, germanium, zinc sulphide and lead telluride.

Such materials make it possible to provide a strong refractive index while still being perfectly compatible with the manufacturing constraints of optoelectronics.

The filling material can be a crystalline or polycrystalline material, such as a crystalline silicon or a crystalline germanium.

The filling material can be an amorphous material, such as a silicon or an amorphous germanium.

The material of the first and of the second metal layer can be one selected in the group comprising copper, silver, gold, aluminium, tungsten, titanium and the alloys thereof.

The support comprises:
- a substrate wherein is arranged at least partially the at least one first structure, with the at least one first structure having an active surface through which the first structure absorbs the electromagnetic radiation,
- a cover arranged in such a way as to encapsulate the active surface of the first structure, with the face of the cover opposite the active surface of the structure forming the detection face of the support.

Such a component using a cover, for example an encapsulated bolometer, benefits particularly from an optical filter according to the invention.

The distribution of the first and second through-holes in the first and the second portion of the optical filter is identical,
and wherein the first and the second through-holes of respectively the first and the second portion are dimensioned so that respectively the first portion is an band-pass optical filter in the first range of wavelengths and that the second portion is an band-pass optical filter in the second range of wavelengths.

Such a configuration of the optical filter opens the applications of measurement and imaging to several wavelengths. Indeed, with a single filter, the component can comprise for each portion a dedicated absorbent structure and as such measure with these structures the electromagnetic radiation that is in the first and second range of wavelengths. Note, in addition, that this is particularly advantageous when these absorbing structures are arranged in the form of a matrix. Indeed, as the pitch of the network of holes is constant, it can be chosen as being a unit fraction of the pitch of the structure matrix, i.e. the pitch of the matrix is an integer multiple of the network pitch. The conception and the manufacture of a component comprising these structures is particularly facilitated.

The invention also relates to a method for manufacturing a component intended for the detection of an electromagnetic radiation in a first range of wavelengths included in the infrared and visible range, said first range of wavelengths being centred around a wavelength $\lambda$, the method comprising the following steps:
- supplying of a support comprising at least one first structure intended for the detection of electromagnetic radiations and a reception face in order to receive the electromagnetic radiation,
- forming of an adaptation zone covering at least partially the reception face of the support and having a refractive index in the first range of wavelengths which is less than 2,
- forming of a metal layer covering the adaptation zone and comprising first through-holes distributed and dimensioned in order to form a frequency selective surface, with each one of the first through-holes containing a filling material of which the refractive index in the first range of wavelengths is greater than 2.

The method can further comprise the following step of:
- forming of a second metal layer, said second metal layer comprising second through-holes according to a configuration that is substantially identical to the first through-holes of the first metal layer, with these second through-holes also containing filling material,
the first and the second metal layer being separated from one another by a distance d by a first hollow space, with the distance d satisfying the following inequalities:

$$\frac{\lambda}{6} \le d \le \frac{\lambda}{3}.$$

The invention also relates to method for manufacturing a component intended for the detecting of an electromagnetic radiation in a first range of wavelengths included in the infrared and visible range, with the method comprising the following steps:
- supplying of a sacrificial substrate,
- forming of a first metal layer, with the first metal layer comprising first through-holes regularly distributed and dimensioned in order to form a frequency selective surface, with each one of the first through-holes containing a filling material of which the refractive index in the first range of wavelengths is greater than 2,
- forming of an adaptation zone on the metal layer in such a way that the adaptation zone is covered by the first metal layer, with the adaptation zone having a refractive index in the first range of wavelengths which is less than 2,
- supplying of a support comprising at least one first structure able to absorb an electromagnetic radiation and a reception face in order to receive the electromagnetic radiation or of a portion of support intended for the forming of such a support and comprising the reception face of said future support,
- transferring of the adaptation zone, first metal layer, second metal layer and sacrificial substrate unit on the reception face in such way that the adaptation zone covers at least partially the reception face,
- suppression at least partially the sacrificial substrate.

The method can further comprise between the step of supplying the sacrificial substrate and the step of forming the first metal layer the following step:
- forming of a second metal layer, said second metal layer comprising second through-holes regularly distributed and dimensioned in order to form a frequency selective surface, with these second through-holes containing a filling material of which the refractive index in the first range of wavelengths is greater than 2,
after the step of forming the second and the first metal layer, the first and the second metal layer being separated from one another by a distance d by a first hollow space, with the distance d satisfying the following inequalities:

$$\frac{\lambda}{6} \le d \le \frac{\lambda}{3}.$$

Such manufacturing methods makes it possible to manufacture a component that benefits from the advantages linked to the invention.

During the step of forming the first metal layer, the first through-holes can be regularly distributed in the first metal layer.

The step of forming the second metal layer can comprise the following sub-steps:

forming of a sacrificial layer on the first metal layer opposite the adaptation zone, the sacrificial layer having the thickness d depositing and structuring of a second metal layer on the sacrificial layer opposite the first sacrificial layer, said second metal layer comprising second through-holes according to a configuration that is substantially identical to the first through-holes of the first metal layer, with these second through-holes also containing filling material, suppression of the sacrificial layer in such a way as to form a first hollow space separating the first and the second metal layer from one another by a distance d.

The step of forming the first metal layer and the step of forming the second metal layer can comprise the following sub-steps:

depositing of the filling material in such a way as to delimit with the filling material at least partially the first through-holes of the first metal layer, depositing of a layer of metal material in such a way as to fill the spaces left free by the filling material in order as such to form the first metal layer.

Such a step of forming the first metal layer is particularly advantageous in order to provide the metal layer since it uses steps that are perfectly compatible with the manufacturing constraints of optoelectronics.

During the step of depositing the filling material, the depositing can be carried out in such a way that the filling material is surrounded with interface material this in order to define during the depositing of the metal material a spacing between the first or second metal layer and the filling material.

Such a method of manufacturing makes it possible to provide a component that benefits from an optimised transmission rate.

BRIEF DESCRIPTION OF THE DRAWINGS

This invention shall be better understood when reading the description of embodiments, provided solely for the purposes of information and in a non-limiting manner, in reference to the annexed drawings wherein.

Identical, similar or equivalent portions of the various figures bear the same numerical references so as to facilitate the passing from one figure to another.

The various portions shown in the figures are not necessarily shown according to a uniform scale, in order to make the figures more legible.

The various possibilities (alternatives and embodiments) must be understood as not being exclusive of one another and can be combined together.

DETAILED DESCRIPTION OF PARTICULAR EMBODIMENTS

Figure 1A:
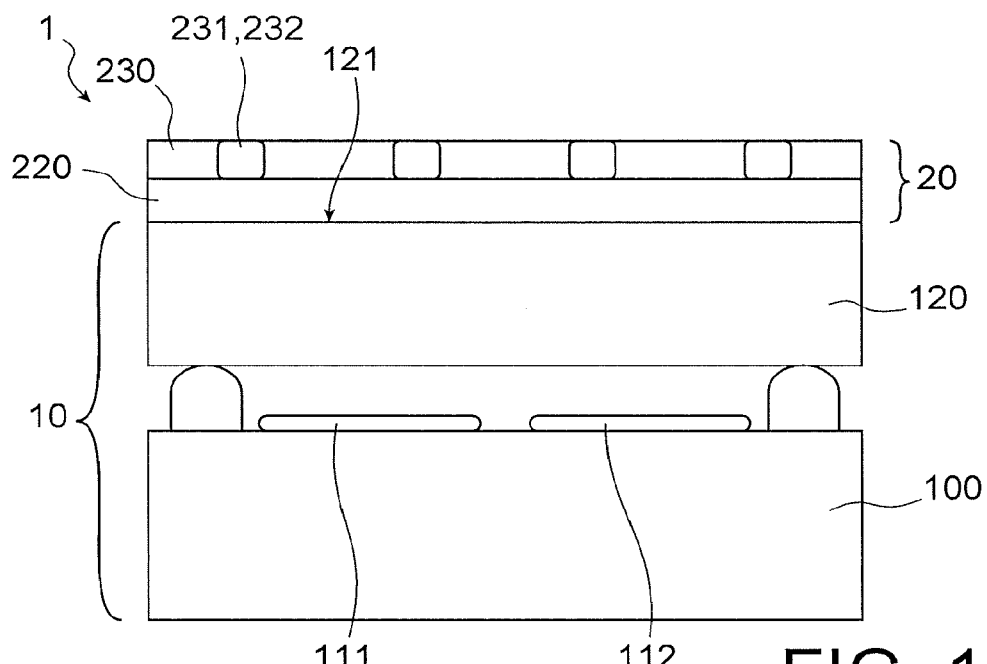
FIGS. 1A and 1B diagrammatically show a component according to a first embodiment of the invention with in FIG. 1A a cross-section view and in FIG. 1B a top view showing the through-holes arranged in the metal layer of the component.
Figure 1B:
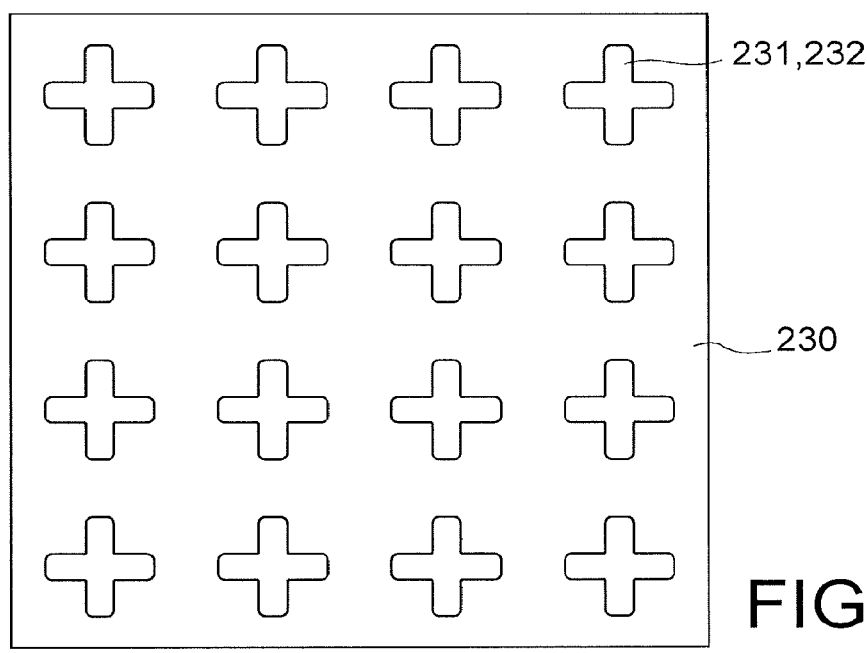

FIGS. 1A and 1B show a component 1 according to a first embodiment showing the advantage of a frequency selective surface having through-holes containing a filling material 232 of which the refractive index in a first range of wavelengths is greater than 2, Such a component 1 according to this first embodiment is intended for the detection and/or the measuring of an electromagnetic radiation in a first range of wavelengths included in the infrared and visible range.

Such a component 1 according to the invention is more particularly dedicated to the detection of radiation in a first range of wavelengths included in the infrared range. Note the infrared range is divided into three sub-domains that are the near-infrared range between 1 and 3 μm, the mid-infrared range between 3 and 5 μm and far-infrared corresponding to the wavelengths between 8 and 14 μm.

Such a component 1 comprises:
- a support 10 comprising a first and a second structure 111, 112 both able to absorb electromagnetic radiation and a reception face 121 in order to receive the electromagnetic radiation,
- an optical filter 20 of the band-pass type in the first range of wavelengths, the optical filter being arranged on the reception face of the support 10 in such a way as to filter the electromagnetic radiation transmitted to the support 10.

The support 10 comprises, as shown in FIG. 1A:
- a substrate 100 wherein are arranged at least partially the first and the second structure 111, 112,
- the first and the second structure 111,112 each comprising an active surface in order to absorb the filtered electromagnetic radiation, said active surface being supported by the substrate 100 in FIG. 1A,
- a cover 120 arranged in such a way as to encapsulate the active surfaces of the first and second structures 111, 112, with the face of the cover opposite the active surfaces of the structures 111, 112 forming the reception face 121 of the support 10.

The substrate 100 is a conventional semiconductor substrate wherein is arranged the reading electronics of the first and second structures 111, 112. Conventionally the substrate 100 can be a substrate made of silicon.

The first and the second structure 111, 112, are both structures of the bolometer type. The first and the second structure 111, 112 both comprise a reading circuit, not shown, and an active surface through which they are referenced in FIG. 1A. The active surface of each one of the first and the second structure 111, 112 is supported by the substrate 100 and is arranged in such a way as to receive the electromagnetic radiation received by the reception face 121.

As such structures 111, 112 are known to those skilled in the art, they are not described more precisely in this document.

The cover 120 makes it possible to encapsulate the active surfaces of the first and second structures 111, 112 in such a way as to define a protective atmosphere for the active surfaces of the latter. The cover 120 is carried out in a material that is at least partially, and preferentially totally, transparent in the first range of wavelengths. As such in the framework of the first embodiment shown in FIG. 1A and a first range of wavelengths comprised in the infrared range, the cover 120 can be formed by a silicon substrate. Alternatively, the cover 120 can also be made of germanium.

The cover has a refractive index in the first range of infrared wavelengths which is generally between 2 and 4, even between 2.5 and 3.5 or 2.6 and 3.

The cover 120 has the reception face 121 of the support 10.

The optical filter 20 is arranged on the support in contact with the reception face 121.

The optical filter 20 comprises:
- a bonding layer 210,
- an adaptation zone 220 covering at least partially the reception face of the support 20, with the adaptation zone 220 being fixed to the reception face 121 by means of the bonding layer 210,
- a first metal layer 230 covering the adaptation zone 220 and comprising first through-holes 231 regularly distributed and dimensioned so that the first metal layer 230 forms a frequency selective surface.

The bonding layer 210 is made from a material that is at least partially transparent in the first range of wavelengths and preferentially transparent in this same first range of wavelengths. The bonding layer 210 has a refractive index less than that of the cover. As such the material of the bonding layer 210 can be a material having a refractive index less than 2, even less than 1.7.

As such, this material of the bonding layer 210 can be, for example, an epoxide polymer such as the epoxide polymer marketed by EPO-TEK™ under the reference EPO-TEK™ 360. Indeed, such a material of the bonding layer 210 has a refractive index in the visible range substantially equal to 1.5.

The bonding layer 210 can be relatively thick and as such be between 100 nm and 1.5 μm, even between 300 nm and 1 μm. Conventionally, the bonding layer can be, for example, of a thickness of 300 nm.

The bonding layer 210 makes it possible to fix the adaptation zone 220 to the reception face 121 of the support 10. As such the adaptation zone 220 covers the reception face 121 of the support 10.

The adaptation zone 220 has the form of a layer and can as such also be referred to as "adaptation layer. The adaptation zone is carried out in a material that is at least transparent in the first range of wavelengths and preferentially transparent in this same first range of wavelengths. The adaptation zone 220, in such a way as to provide a refractive index symmetry around the first metal layer 230 forming a frequency selective surface, has a refractive index less than or equal to 2 and preferentially less than 1.7, or 1.5 even less than 1.2 or further substantially equal to 1.

As such, the adaptation zone 220 can be made in a material selected in the group comprising silicon dioxide $SiO_2$ and silicon nitride $Si_3N_4$. The thickness of the adaptation zone 220 is between 50 nm and 1.5 μm and preferentially between 150 nm and 600 nm.

For example, the thickness of the adaptation zone 220 can be between 250 and 350 nm for a first range of wavelengths comprised in the mid-infrared range and between 550 and 650 nm for a first range of wavelengths comprised in the far-infrared range.

The first metal layer 230 covers the adaptation zone 220.

The first metal layer 230 has a thickness greater than the skin thickness in such a way as to ensure that the first metal layer is opaque with respect to the electromagnetic radiation. As such the thickness of the first metal layer 230 is greater than or equal to $$\frac{\lambda_r}{100}$$

with $\lambda_r$ the lower limit of the first range of wavelengths. As such for an application in the infrared range, i.e. a range of wavelengths greater than 1 μm, the thickness of the first metal layer is greater than or equal to 100 nm.

The first metal layer is preferentially made from a metal selected in the group comprising copper, silver, gold, aluminium, tungsten, titanium and the alloys thereof.

The first metal layer 230 comprises first through-holes 231 in such a way as to form a frequency selective surface. The first metal layer comprising a first and a second face, the first face being the one in contact with the adaptation zone, each through-hole 231 opens, by definition, into each one of the first and the second face of the first metal layer 230. The first through-holes 231 are regularly distributed over the first metal layer 230 in order to form a regular network of through-holes such as a square network or a hexagonal network. The pitch of the network of first through-holes 231, or period, is preferentially chosen as being less than the lower limit in length of the first range of wavelengths this in such a way as to avoid any photonic guided mode in the optical filter 20. As such, for a first range of wavelengths in the mid-infrared range the pitch of the network of first through-holes 231 can be chosen as being less than 3 µm.

According to an alternative of the invention not shown, the first through-holes can be distributed in the first metal layer 230 irregularly. According to this alternative of the invention, the distance between each first through-hole 231 and the first through-hole 231 which is the closest to it which is preferentially chosen less than the lower limit in length of the first range of wavelengths this in such a way as to avoid any photonic guided mode in the optical filter 20.

FIG. 1B shows an example of such an arrangement of the first through-holes 231. The dimensioning of the first through-holes 231, according to the principle of the frequency selective surfaces, are shaped and dimensioned in such a way as to define the first range of wavelengths. As such, the first through-holes 231 shown in FIG. 1B are holes in the form of a cross.

Figure 2A:
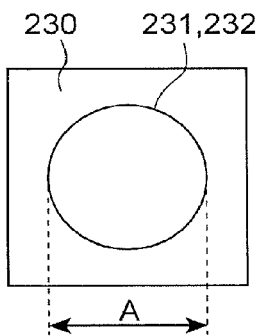
FIGS. 2A to 2C show respectively three examples of shapes of the first through-holes for a first metal layer of a component according to the invention, FIGS. 3A to 3H diagrammatically show the main steps of manufacturing the component shown in FIGS. 1A to 1B, FIGS. 4A and 4B graphically show the improvement provided by the use of an interface material arranged between the metal layer and a filling material with respectively in FIG. 4A the transmission spectra of optical filters according to the invention not comprising such a filling material and in FIG. 4B those for optical filters according to the invention comprising such a filling material.
Figure 2B:
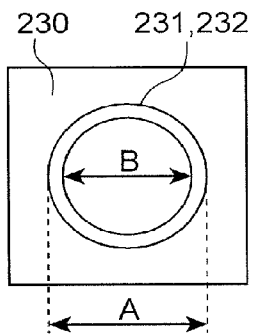
Figure 2C:
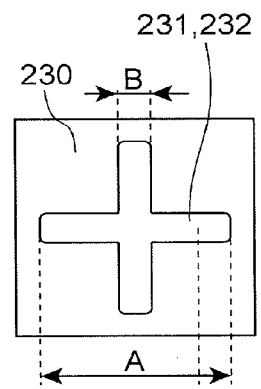

Of course, the invention is not limited to only this shape of first through-holes 231. As such, the first through-holes 231 can also just as easily be circular or annular holes, or in the shape of a cross, as shown in FIGS. 2A to 2C or can be of any other shapes, such as for example a square or hexagonal shape.

According to the shape of the first through-holes 231, the first through-holes can have two lateral dimensions A and B, with one A being a so-called maximum dimension and the other B being a so-called minimum dimension. It can also be seen in FIG. 2A, that the circular holes having an isotropic shape, comprise only one dimensional characteristic A while the holes with an annular shape and in the shape of a cross each have a maximum dimension A and a minimum dimension B. As such, in the case of an annular shape, the maximum and minimum dimensions correspond respectively, as shown in FIG. 2B to the outer and inner diameters of the ring. For a shape in the shape of a cross, such as shown in FIG. 2C, the maximum A and minimum B dimensions correspond respectively to the width of the cross and to the thickness of the branches of the cross. The first range of wavelengths depends directly on these two lateral dimensions A and B.

As such, for example, the maximum dimension A can be chosen between 400 and 1400 nm for a first range of wavelengths comprised in the mid-infrared range and between 800 and 2400 nm for a first range of wavelengths comprised in the far-infrared range. Likewise, the minimum dimension B can be chosen between 300 and 800 nm for a first range of wavelengths comprised in the mid-infrared range and between 600 and 2000 nm for a first range of wavelengths comprised in the far-infrared range. Of course, the minimum dimension B is by definition chosen as being less than the maximum dimension A.

More generally, the lateral dimensions A and B of the first through-holes can be calculated easily by those skilled in the art using routine calculations. Such routine calculations are perfectly within the scope of those skilled in the art who have had knowledge of this disclosure.

Note that the ratio of the minimum dimension B over the maximum dimension A makes it possible to define the width of the transmission peak and therefore of the first range of wavelengths. A low ratio B over A makes it possible as such to obtain narrower peaks while a ratio B over A approaching 1 makes it possible to maximise the width of the peaks, with all other parameters remaining equal.

Each through-hole 231 contains a filling material 232 of which the refractive index in the first range of wavelengths is greater than 2. This filling material 232 preferentially has a refractive index in the first range of wavelengths that is greater than 3. The filling material 232 can be chosen in the group comprising silicon aSi in amorphous form, germanium aGe in amorphous form, zinc sulphide and lead telluride PbTe.

Figure 3A:
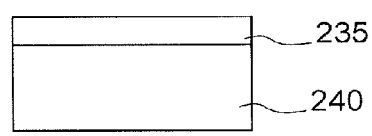
Figure 3B:
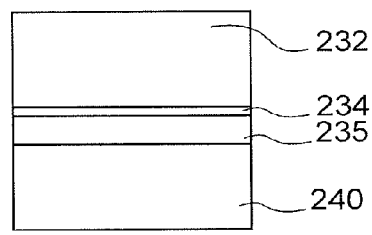
Figure 3C:
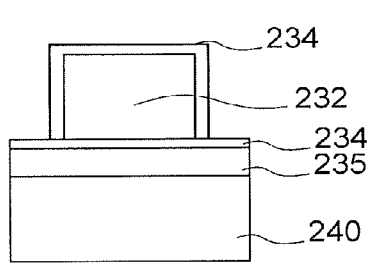
Figure 3D:
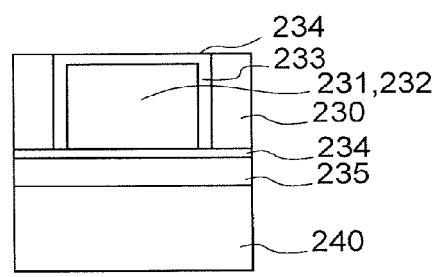
Figure 3E:
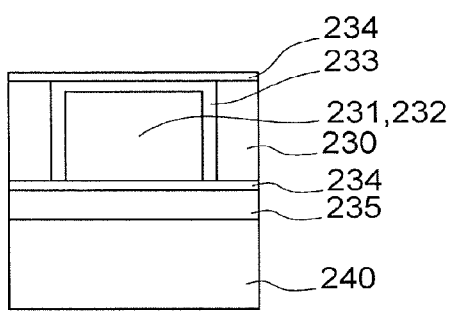
Figure 3F:
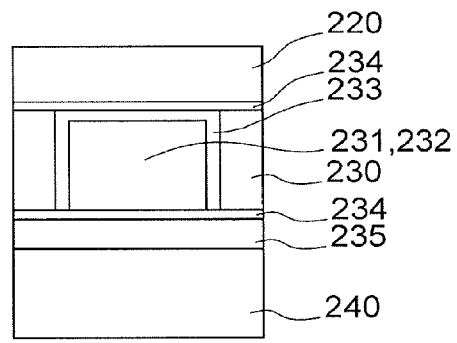
Figure 3G:
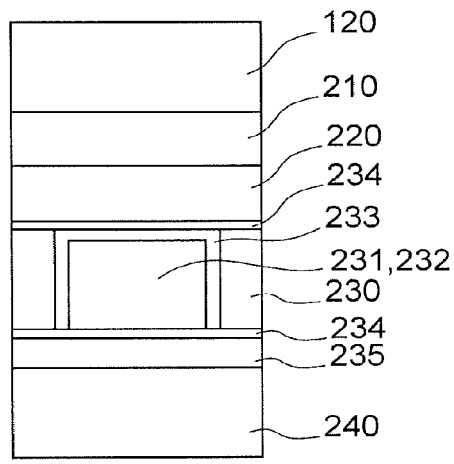
Figure 3H:
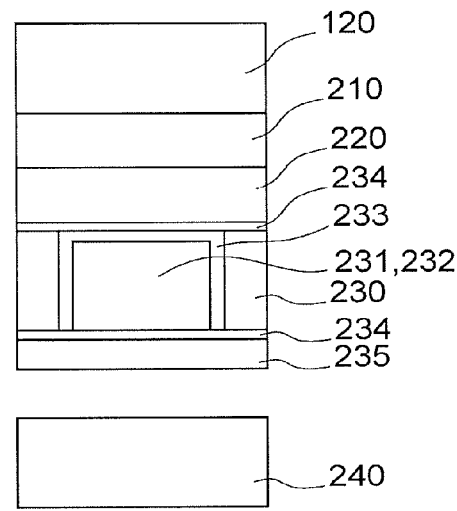

According to an optional characteristic of the invention, in particular shown in FIG. 3H, it can be provided in each one of the first through-holes 231 a spacing 233 between the first metal layer 230 and the filling material 232. Such a spacing 233 makes it possible to create, between the first metal layer 230 and the filling material 232, an interface with a low refractive index relatively to the refractive index of the filling material 232.

In order to define such an interface with a low refractive index, according to a first alternative of this optional characteristic, the spacing 233 between the first metal layer 230 and the filling material 232 can contain an interface material 234. This interface material 234 is therefore chosen as having a refractive index in the first range of wavelengths less than that of the filling material 232, preferentially less than 2, even 1.5 or 1.2.

The interface material 234 can as such be selected in the group comprising silicon dioxide $SiO_2$, silicon nitride $Si_3N_4$. The interface material 234 can also be identical to that of the adaptation zone 220.

According to this alternative and as shown in FIG. 3H, the interface material 234 can also act as an interface between the filling material 232 and the adaptation zone. In the same way, the interface material 234 can also entirely encapsulate the filling material 232. According to this possibility, such as shown in FIG. 3H, the first metal layer 230 can also be covered with the interface material 234 both on its face facing the adaptation zone 220, the interface material 234 then acting as an interface between the adaptation zone and the first metal layer 220, as well as on its face opposite the adaptation zone 220. Note that in this case, the interface material 234 preferentially has a refractive index close to 1, i.e. less than 2, preferentially less than 1.7 or 1.5 even 1.2 and advantageously equal to 1, in order to limit the rupture of the index on each one of the faces of the first metal layer 230.

According to a second alternative of this optional characteristic, not shown, the spacing 233 between the filling material 232 and the first metal layer 230 can be devoid of material. In this way, the spacing 233 has the refractive index of the air in the first range of wavelengths, i.e. a refractive index equal to 1.

It can be noted that according to another optional characteristic not shown in FIG. 1A and shown in FIG. 3H, the first metal layer 230 can be covered, on its face opposite the adaptation zone, with a cladding layer, such as a layer of silicon dioxide $SiO_2$ or of silicon nitride $Si_3N_4$. Such a cladding layer, formed in FIG. 3H by the interface material 234 preferentially has a refractive index close to 1, i.e. less than 2, preferentially less than 1.7 or 1.5, even 1.2, and advantageously equal to 1.

FIGS. 3A to 3H show a method for manufacturing a structure according to the first embodiment the invention wherein the adaptation zone 220 is fixed to the cover 120 by means of a layer of glue 210. Such a method comprises the following steps:

supplying of a sacrificial substrate 240, forming on the sacrificial substrate 240 of a dielectric layer 235, such as a layer of silicon dioxide $SiO_2$, such as shown in FIG. 3A, depositing of a first cladding layer carried out in the interface material 234, with this layer able to be, for example, 35 nm thick, depositing on the first interface layer of a layer of filling material 232, such as a silicon in amorphous form, as shown in FIG. 3B, selective etching of the layer of filling material 232 in such a way as to define the shape of the first through-holes 231 of the first metal layer 230, selective deposit of interface material 234 on the filling material 232 in such a way as to encapsulate the filling material 232, as shown in FIG. 3C, depositing of a metal, such as copper in contact with the surface of the first interface layer in the spaces left free by the filling material 232 in order to form the first metal layer 230, such as shown in FIG. 3D, depositing of a second layer of interface material 234, such as a layer of silicon nitride, as shown in FIG. 3E, depositing of the adaptation zone 220 in contact with the second layer of interface material, such as shown in FIG. 3F, supplying of the cover 120, the cover 120 being a portion of the support 10 intended for the forming of such a support 10 and comprising the reception face 121 of said future support 10, fixing of the adaptation zone 220 via its opposite face to the first metal layer 230 on the cover 120 by means of a bonding layer 210, as shown in FIG. 3G, suppression of the sacrificial substrate 240, as shown in FIG. 3H.

As such, after transfer of the cover 120 onto the rest of the support 10 in such a way as to form the component 1, the optical filter 20 formed by the adaptation zone 220 and the first metal layer 230 is in contact with the reception face 121 of the support 10 by means of the bonding layer 210.

Advantageously the thickness of the dielectric layer 235 is less than the thickness of the adaptation zone 220 divided by 3.

Even more preferentially, the dielectric layer 235 is less than 100 nm even much less than 100 nm, i.e. less than 50 nm even 20 nm. Indeed, the inventors observed surprisingly and contrary to the understanding of those skilled in the art, the effective section is particularly substantial with such a dimensioning of the dielectric layer 235.

It can be notes that as an alternative of this first embodiment of the invention, during this method of manufacturing, the sacrificial substrate may not be suppressed or be suppressed only partially (i.e. be thinned). According to this alternative, it is then preferable that the cumulative thicknesses of the dielectric layer 235 and of the substrate 240 be of the same magnitude as the thickness of the adaptation zone 220.

According to an alternative of this first embodiment, it can also be considered that the step of depositing the dielectric layer 235 be omitted. According to this alternative, it can also be considered that during the step of suppressing the sacrificial substrate 240, the cladding layer also be suppressed. The step of depositing metal in order to form the first metal layer 230 can be a step according to the damascene method. Such a step of depositing according to the damascene method comprises the following sub-steps:

depositing of a first metal nucleation layer, for example via cathode pulverisation, depositing the rest of the first metal layer via an electrolytic deposit, thermal annealing, polishing of the first metal layer in such a way as to suppress the metal deposited on the filling material 232.

Figure 4A:
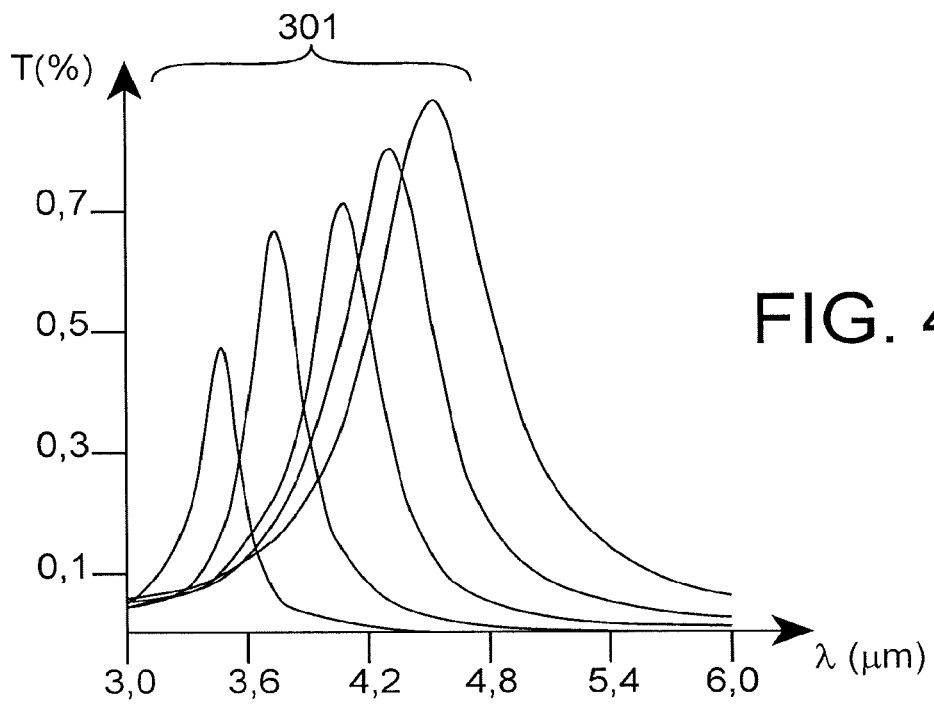
Figure 4B:
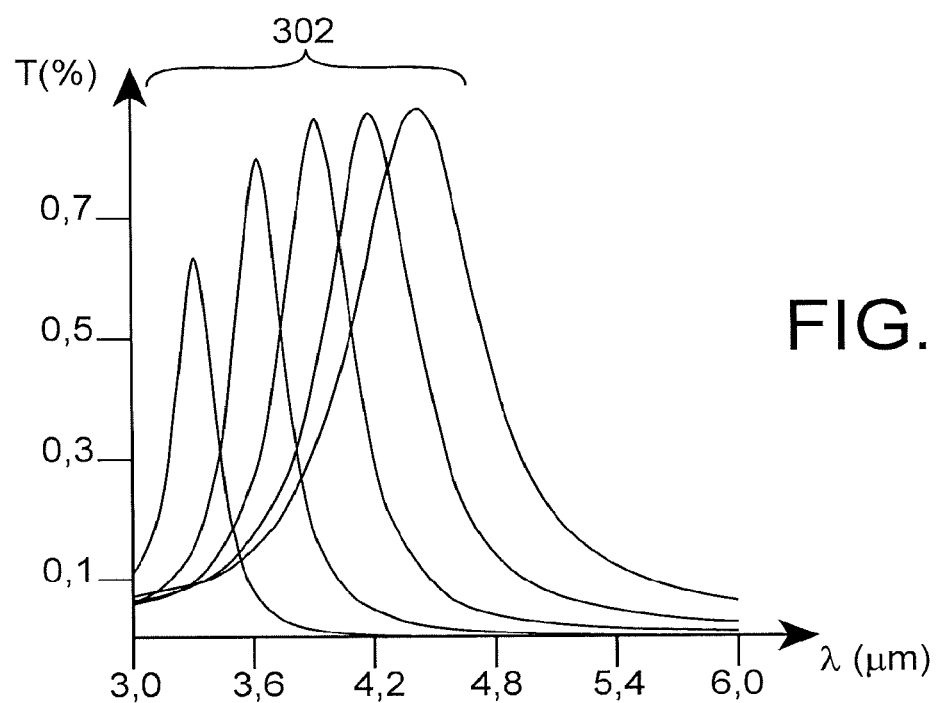

FIGS. 4A and 4B show examples of transmission spectra of respectively:

optical filters 20 according to the invention wherein a spacing 233 is not provided between the first metal layer 230 and the filling material 232, the first through-holes 231 being therefore entirely filled with filling material 232 such as is shown in FIG. 1A optical filters 20 according to the invention and for which a spacing 233 is provided between the filling material 232 and the first metal layer 230, with this latter space 231 being filled with a silicon nitride $Si_3N_4$ as an interface material 234, such as is shown in FIG. 3H.

Each one of these FIGS. 4A and 4B show the transmission rate as a percentage according to the wavelength in micrometers.

Of course, in such a way as to allow for a comparison between the transmission spectra of FIGS. 4A and 4B, the dimensioning of the optical filters 20 used to carry out the spectra of FIG. 4B is identical to those used to carry out the spectra of FIG. 4A. Note as such a strong increase in the transmission rate with the presence of the interface material 234 for the optical filters 20 adapted for the ranges of mid-infrared wavelengths, with those of far-infrared being little affected.

As such the use of a spacing 233 between the first metal layer 230 and the filling material 232 makes it possible to significantly increase the transmission rate for the ranges of wavelengths in the mid- and -near infrared ranges.

With regards to the optimum dimensioning of such a spacing 233, the following table 1 shows the losses induced by the metal layer for an electromagnetic radiation in the wavelength range this for different thicknesses of the spacing 233. For these calculations, the simulated structure is that shown in FIG. 1A with the following characteristics:

the metal layer 220 is a layer of copper 200 nm thick, the filling material 232 is amorphous silicon with a refractive index in the first range of wavelengths of 3.5, the interface material 234 is silicon nitride with a refractive index in the first range of wavelengths of 1.9, the thickness of the interface layer 234 varies between 0 and 100 nm, the through-holes 231 are of the type of those shown in FIG. 2B with the dimension A, i.e. the outer diameter, equal to 900 nm, and the dimension B, i.e. the inner diameter, equal to 250 nm, the adaptation zone 220 is made of silicon dioxide with a refractive index in the first range of wavelengths of 1.5 and has a thickness of 200 nm, It can be seen in this table, in concordance with the transmission spectra of FIGS. 4A and 4B, that the spacing 233 makes it possible to decrease the losses in the first range of wavelengths induced by the first metal layer.

TABLE 1

Loss induced by the metal layer in the wavelength range according to the thickness of the spacing 233 between the metal layer 230 and the filling material 232

| Thickness (nm) | Loss in dB/μm |
|---|---|
| 0 | 0.2227 |
| 20 | 0.1790 |
| 50 | 0.1651 |
| 100 | 0.1733 |

Figure 5:
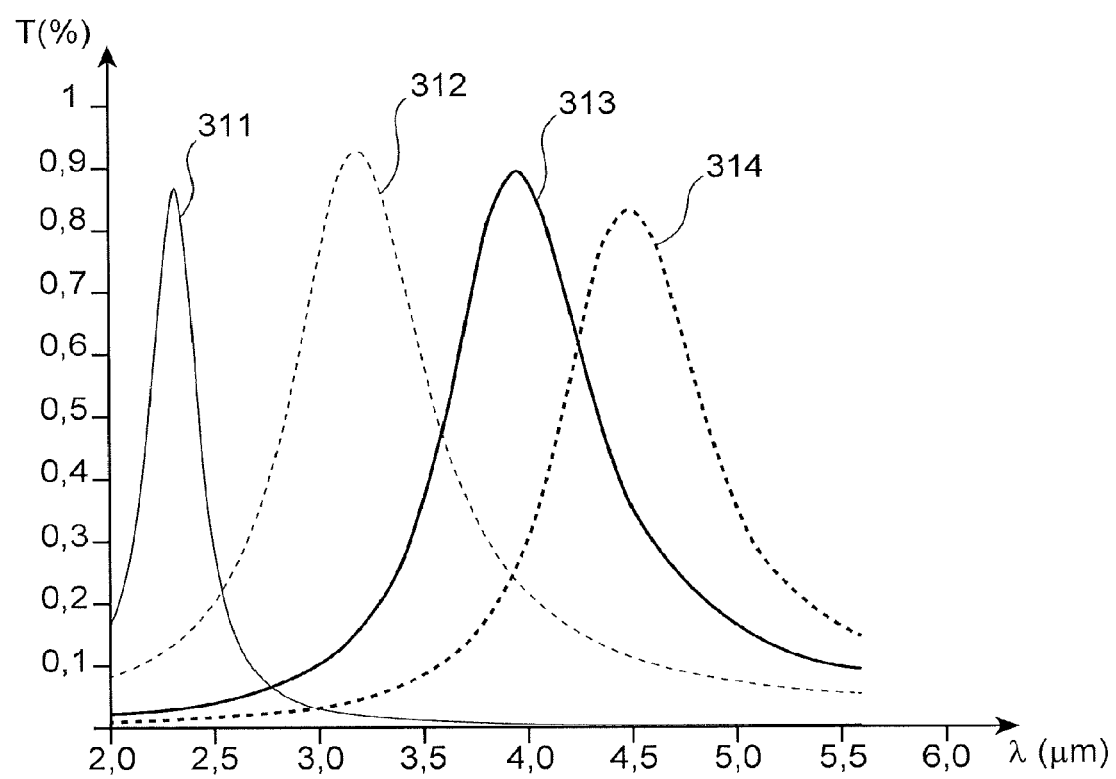
FIG. 5 shows transmission spectra for optical filters of components according to a practical embodiment according to the invention with four different dimensionings of the first through-holes of the first metal layer, FIGS. 6A and 6B diagrammatically show a component according to a second embodiment of the invention with in FIG. 6A a cross-section view and in FIG. 6B a top view showing the through-holes arranged in the metal layer of the component.

In order to illustrate principle of the invention in a practical manner, FIG. 5 graphically shows several transmission spectra 311, 312, 313, 314 of optical filters 20 according to a practical embodiment of the invention.

This practical embodiment of the invention is compliant with the component 1 shown in FIG. 1A for which the first through-holes 231 are of annular shape, such as shown in FIG. 2B. The characteristics of the component 1 according to this practical embodiment are as follows:
- a cover 120 made of crystalline silicon Si with a refractive index in the first range of wavelengths of about 3.5,
- an adaptation zone 220 of 200 nm made of silicon dioxide $SiO_2$ and with a refractive index in the first range of wavelengths of about 1.5,
- a first metal layer 230 made of copper 100 nm thick,
- of the first through-holes 231 distributed according to a square network of which the pitch is 1500 nm
- the filling material is silicon in an amorphous form aSi with a refractive index in the first range of wavelengths of about 3.5,
- an interface material made of silicon nitride $Si_3N_4$ with a refractive index in the first range of wavelengths of 1.9.

The first through-holes 231 of the optical filters 20 corresponding to the first, second, third and fourth transmission spectra 311, 312, 313, 314 have respectively a maximum dimension A of 520, 815, 815 and 720 nm. The minimum dimension B respective of the first through-holes 231 of the optical filters 20 corresponding to the first, second, third and fourth transmission spectra 311, 312, 313, 314 is respectively equal to 0, 0, 420 and 590 nm. Of course a zero minimum dimension B corresponds to a through-hole of which the transversal is in the shape of a disc such as shown in FIG. 2A.

These same transmission spectra can also be obtained with a network pitch of the first through-holes 231 equal to 1 μm. In this case, the maximum dimension A respective of the first through-holes 231 of the optical filters 20 corresponding to the first, second, third and fourth transmission spectra 311, 312, 313, 314 is respectively equal to 520, 770, 770 and 750 nm. With regards to the minimum dimension B, the latter is equal for the first through-holes 231 of the optical filters 20 corresponding to the first, second, third and fourth transmission spectra 311, 312, 313, 314 respectively to 0, 250, 460 and 570 nm.

Figure 6A:
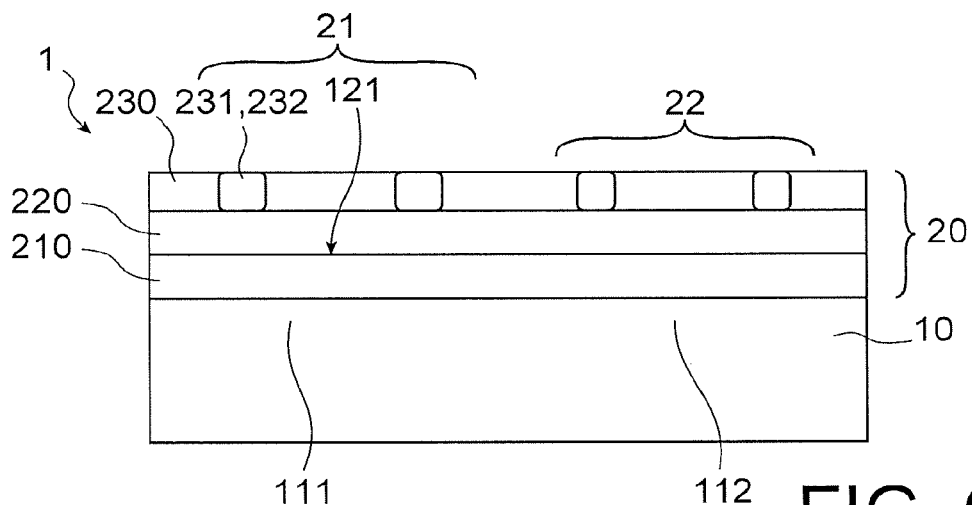
Figure 6B:
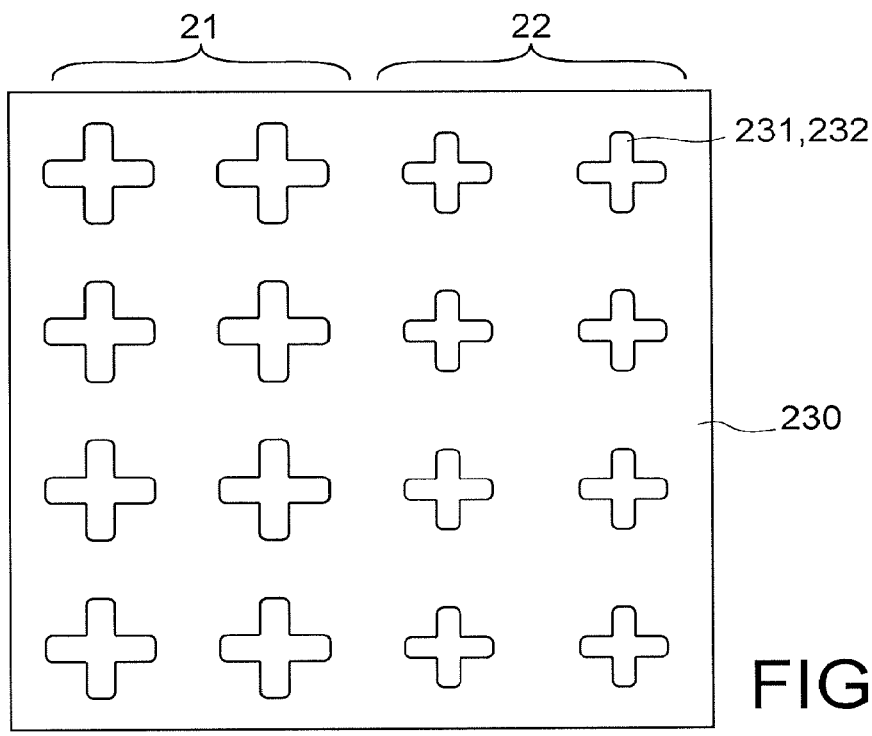

FIGS. 6a and 6b show a component according to a second embodiment of the invention wherein the optical filter 20 has a first portion 21 wherein the filter is a band-pass filter in the first range of wavelengths and a second portion 22 wherein the filter is a band-pass filter in a second range of wavelengths. A component 1 according to this second embodiment is differentiated from a component 1 according to the first embodiment in that the support 10 is constituted of a single substrate wherein a first and second structure 111, 112 are arranged and in that the optical filter 20 is configured to make it possible to filter two ranges of wavelengths.

The support 10 is in this embodiment a semiconductor substrate or comprising at least one semiconductor layer, such as for example a silicon substrate or a substrate made of semiconductor III-V or made of semiconductor II-VI.

The support 10 comprises a first and a second face, with the first face forming a reception face 121 in order to receive the electromagnetic radiation.

The first and the second structure 111, 112 are both structures of the photodiode type. As such the first and second structure 111, 112 can indeed be photodiodes of the PIN type, i.e. comprising an intrinsic zone, as well as avalanche photodiodes. According to another possibility of the invention the first and the second structure 111, 112 can also be photodetectors of the barrier type also known under the denominations nBn and pBp.

Each one of the structures 111, 112 has an active surface through which the structure absorbs the electromagnetic radiation. This active surface of each one of the structures 111, 112 is on the surface of the reception face 121 of the support 10. In this way, in this second embodiment, the active surface of each one of the structures 111, 112 is in contact with the optical filter 20. With such a configuration, the association between the first and second portions 21, 22 with respectively the first and the second structure 111, 112 is particularly facilitated.

Contrary to the component 1 according to the first embodiment, the placing of the optical filter 20 on the reception face of the support is carried out by means of a bonding layer 210, the bonding layer 210 then acting as an interface between the adaptation layer 220 and the reception face 121.

The through-holes 231 are arranged in the first and the second portion 21, 22 of the optical filter 20 according to a square network with a constant pitch. As such, the first and the second portion 21, 22 of the optical filter 20 is distinguished only by the shape of the through-holes 231 that they contain. The dimensioning of the through-holes 231 of the first portion 11, in particular their maximum A and minimum B dimensions, is as such defined to correspond to the first range of wavelengths while the dimensioning of the through-holes 231 of the second portion 22 is defined to correspond to the second range of wavelengths. In this way, it is mostly the portions of the electromagnetic radiation that are respectively in the first and the second wavelength range which are transmitted respectively to the first and to the second structure 111, 112.

Although the component 1 according to this second embodiment can be manufactured in a manner similar to the method of manufacturing described for the first embodiment, it can also be manufactured alternatively according to the following method.

The method of manufacturing comprises the following steps of:
- supplying the support 10 comprising the first and the second structure 111, 112 and the reception face 121 in order to receive the electromagnetic radiation,
- forming the adaptation layer 220 covering at least partially the reception face 121 of the support 10 and having a refractive index in the first range of wavelengths which is less than 1.5,
- forming the metal layer 230 covering the adaptation layer 220 and comprising through-holes 231 regularly distributed and dimensioned in order to form a frequency selective surface, with each one of the through-holes 231 containing a filling material 232 of which the refractive index in the first range of wavelengths is greater than 2.

This last step of forming the metal layer 230 can, in a manner similar to the method for manufacturing a component according to the first embodiment, comprise in order to form the metal layer 230 a step of depositing metal according to the damascene method.

Figure 7:
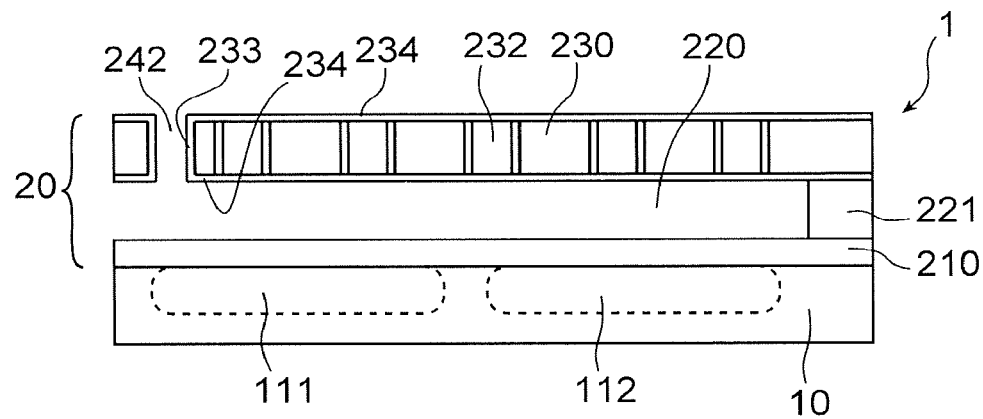
FIG. 7 shows a component according to an alternative of the first embodiment shown in FIGS. 1A and 1B wherein the adaptation zone is supplied by a second hollow space.

FIG. 7 shows a component according to a third embodiment of the invention wherein the adaptation zone 220 is formed by a second hollow space arranged between the support and the first metal layer 230. Such a second hollow space has, indeed, through the gas that it contains, or the low pressure within, a refractive index in the first range of wavelengths which is close to 1, even equal to 1. Such an index close to 1 is as such particularly advantageous in the framework of the invention, since it makes it possible to optimise the rejection rate of the optical filter 20 that the component comprises.

Such a component is differentiated from a component according to the first embodiment of the invention in that the support 10 is constituted of a single substrate wherein a first and second structure 111, 112 are arranged, in that the optical filter 20 is configured to make it possible to filter two ranges of wavelengths, and in that the adaptation zone is hollow except for an element forming a pillar 221 which makes it possible to ensure the spacing between the bonding layer 210 and the first metal layer 230.

According to this third embodiment, the support 10 comprises a first and a second face, with the first face forming a reception face 121 in order to receive the electromagnetic radiation.

The first and the second structure 111, 112 are, as in the second embodiment, both structures of the photodiode type and only their location is shown as a dotted line in FIG. 7. The active surface of each one of the structures 111, 112 is on the surface of the reception face 121 of the support 10.

Contrary to the component 1 according to the first embodiment, the placing of the optical filter 20 on the reception face of the support is carried out by means of a bonding layer 210, the bonding layer 210 then acting as an interface between the adaptation zone 220 and the reception face 121.

The method for manufacturing a component according to this third embodiment is differentiated from the method described in relation with FIGS. 3A to 3H in that:
- during the depositing of the metal in order to form the first metal layer, a piercing 242 is arranged in the latter in order to authorise the suppression of a sacrificial layer, not shown, arranged at the location of the adaptation zone 220,
- the step of fixing the adaptation zone onto the support 10 is not provided
- the step of depositing the adaptation zone comprises the following sub-steps:
  - depositing of a first sacrificial layer in contact with the second layer of interface material, with an opening being provided for the forming of the pillar 221,
  - forming of the pillar 221 through the opening provided,
  - fixing of the first sacrificial layer via its opposite face to the first metal layer 230 on the support 10 by means of a bonding layer 210, with the pillar 221 also being fixed to the support by means of the bonding layer 210,
  - etching of the first sacrificial layer through the piercing 242.

Figure 8:
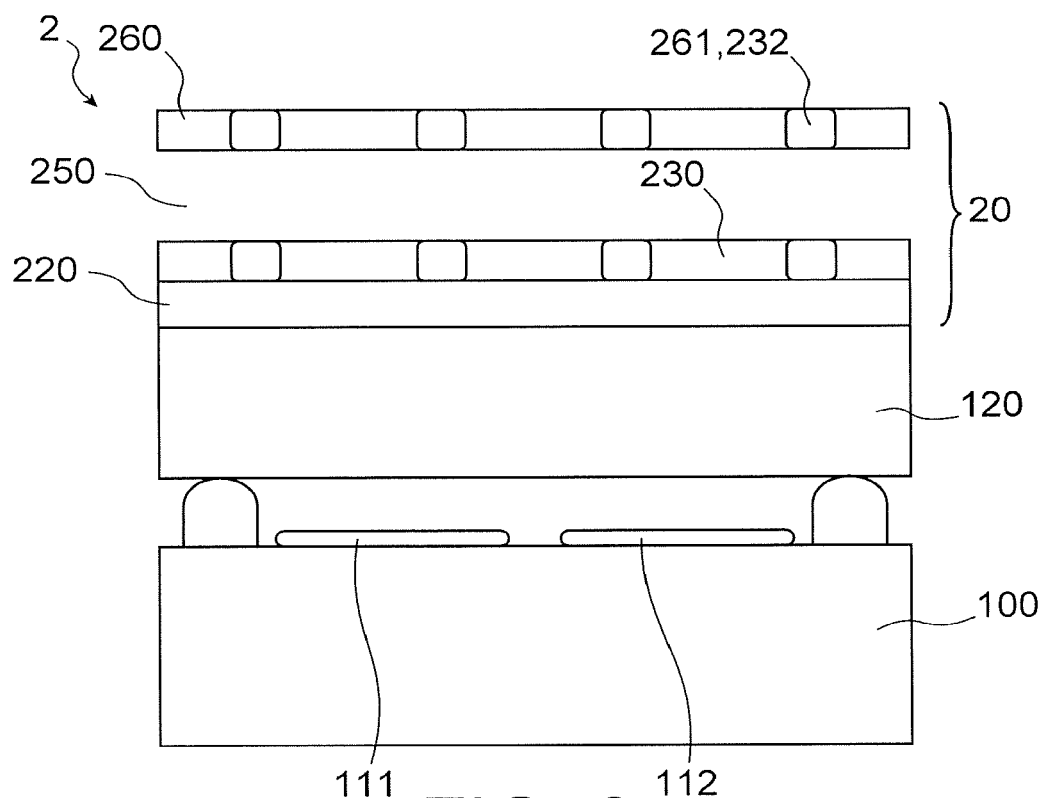
FIG. 8 shows a component according to a second embodiment wherein a second metal layer is provided forming a frequency selective surface.

FIG. 8 shows a component 2 according to a fourth embodiment of the invention. Such a component 2 is differentiated from a component 1 according to the first embodiment in that a second metal layer 260 is provided forming a frequency selective surface and in that the first and the second metal layer 230, 260 are separated from one another by a first hollow space 250. Such a component 1 makes it possible, in addition to the advantages already presented for a component according to the first embodiment of the invention, to obtain an optimised rejection rate through the presence of the second metal layer 260 without the transmission rate in the first range of wavelengths being significantly affected.

The second metal layer 260 has a configuration that is substantially identical to that of the first metal layer 230. As such the second metal layer 260 comprises second through-holes 261 according to a configuration that is substantially identical to the first through-holes 231 of the first metal layer 260, with these second through-holes 261 also containing filling material 232 and the interface material 234, not shown and which is present in a spacing 233 between the second metal layer 260 and the filling material 234.

The first and the second metal layer 230, 260, extend parallel to one another spaced by the first hollow space 250 by a distance d. The distance d satisfies the following inequalities:

$$\frac{\lambda}{6} \leq d \leq \frac{\lambda}{3}, \quad (1)$$

λ being the wavelength around which is centred the first wavelength range. Ideally, and in particular when the filter does not comprise a second portion in order to filter in a second wavelength range, d is chosen as substantially equal to λ/4.

It can be noted that according to a possibility of the invention not shown, it is also possible to optimise the metal inter-layer spacing zone even if the latter is not supplied by a first hollow space 250 according to the invention. Such an optimisation can be obtained by supplying a metal inter-layer spacing zone carried out in a material having a refractive index in the first range of wavelengths less than 2, preferably 1.7, even 1.5 and by dimensioning this metal inter-layer zone in such a way that it separates the first and the second metal layer 230, 260 by a distance d that satisfies the following equation:

$$\frac{\lambda}{6n} \leq d \leq \frac{\lambda}{3n}, \quad (2)$$

λ being the wavelength around which is centred the first wavelength range and n the refractive index of the metal inter-layer spacing zone. Ideally, and in particular when the filter does not comprise a second portion in order to filter in a second wavelength range, d is chosen as substantially equal to λ/4n.

As such, the optical filter 20 according to the invention comprises:
- a bonding layer 210,
- an adaptation zone 220 covering at least partially the reception face of the support 20, the adaptation zone 220 being fixed to the reception face 121 by means of the bonding layer 210,
- a first metal layer 230 covering the adaptation zone 220 and comprising first through-holes 231 regularly distributed and dimensioned so that the first metal layer 230 forms a frequency selective surface,
- a first hollow space 250, a second metal layer 250 covering the adaptation zone 220 and comprising second through-holes 261 regularly distributed and dimensioned according to a configuration that is substantially identical to the first through-holes 231 of the first metal layer 230, with the first hollow space 250 separating by the distance d the first and the second metal layer 230, 260.

Note that FIG. 8 makes it possible to illustrate the principle of a component according to the invention and that the latter does not have the support elements, such as pillars or an outer frame, that make it possible to ensure the maintaining of the second metal layer 260 spaced from the first metal layer 230 and therefore to form the first hollow space 250. Of course such elements are generally present as shown in FIG. 9J which shows the presence of such a pillar 210.

Figure 9A:
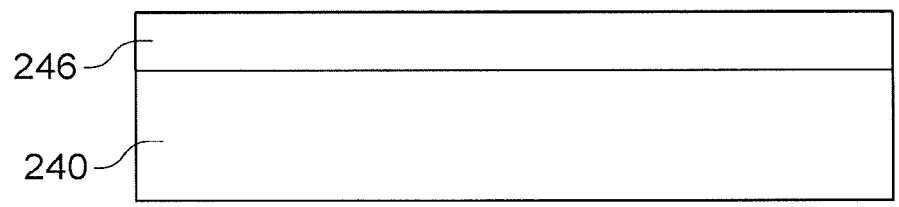
FIGS. 9A to 9J show the steps of manufacturing a component according to the second embodiment comprising a design similar to that of the component according to the alternative of the first embodiment shown in FIG. 7.
Figure 9B:
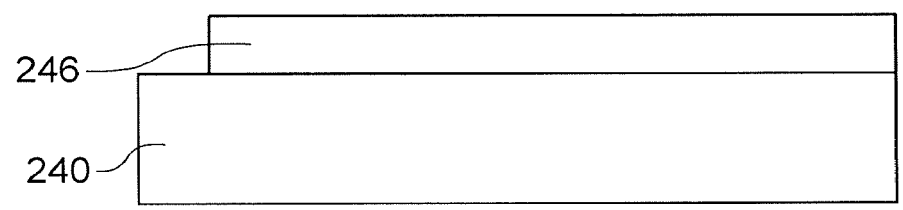
Figure 9C:
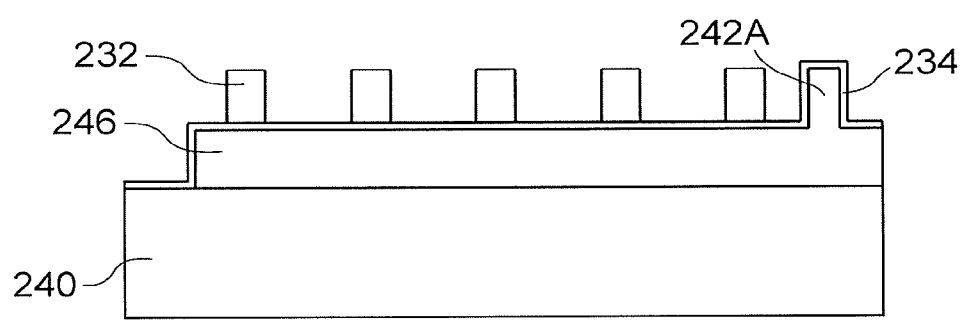
Figure 9D:
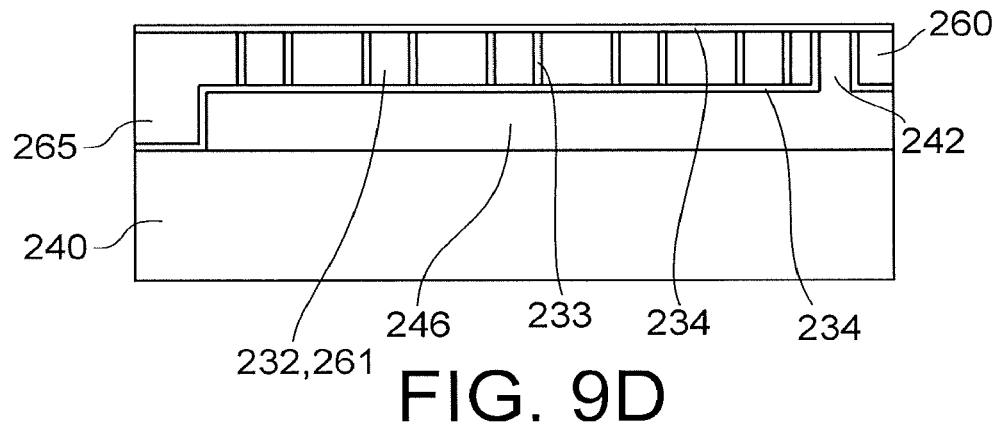
Figure 9E:
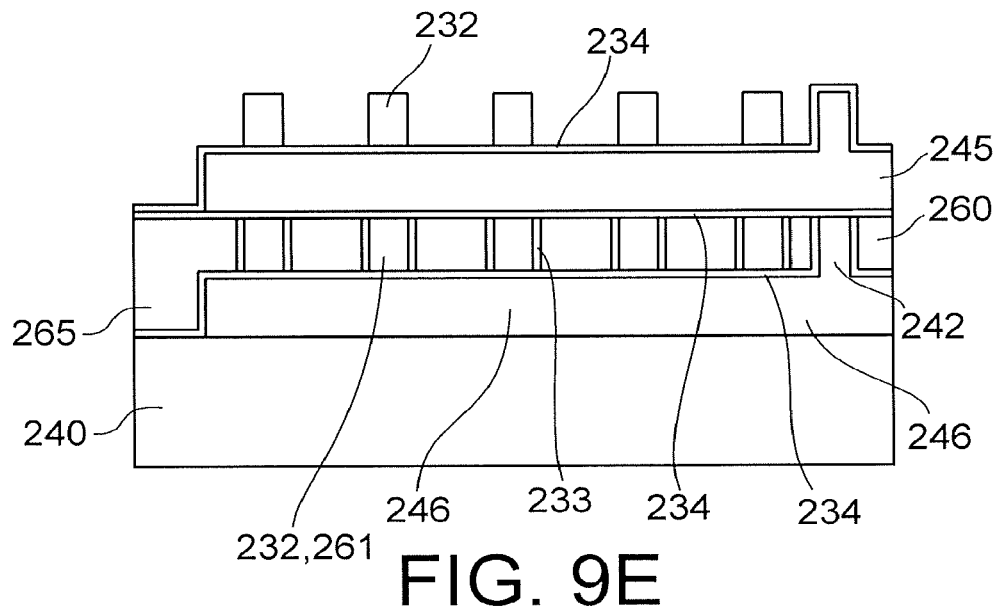
Figure 9F:
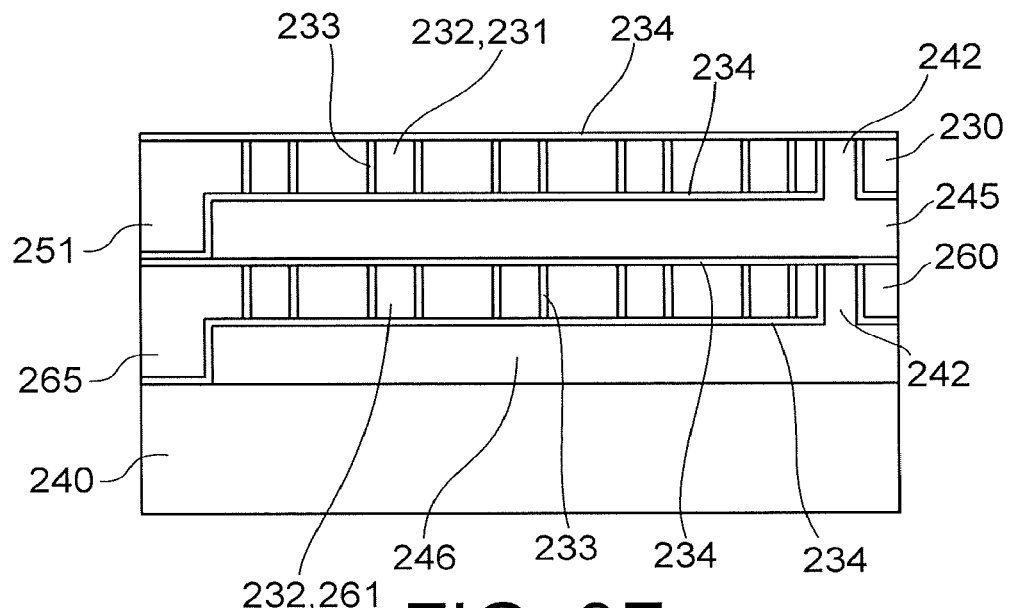
Figure 9G:
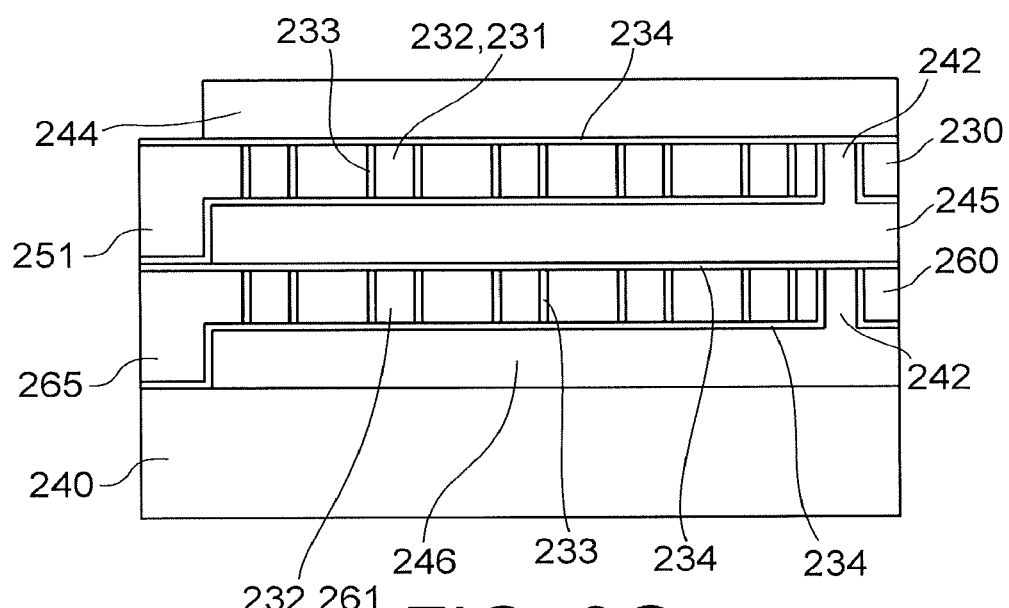
Figure 9H:
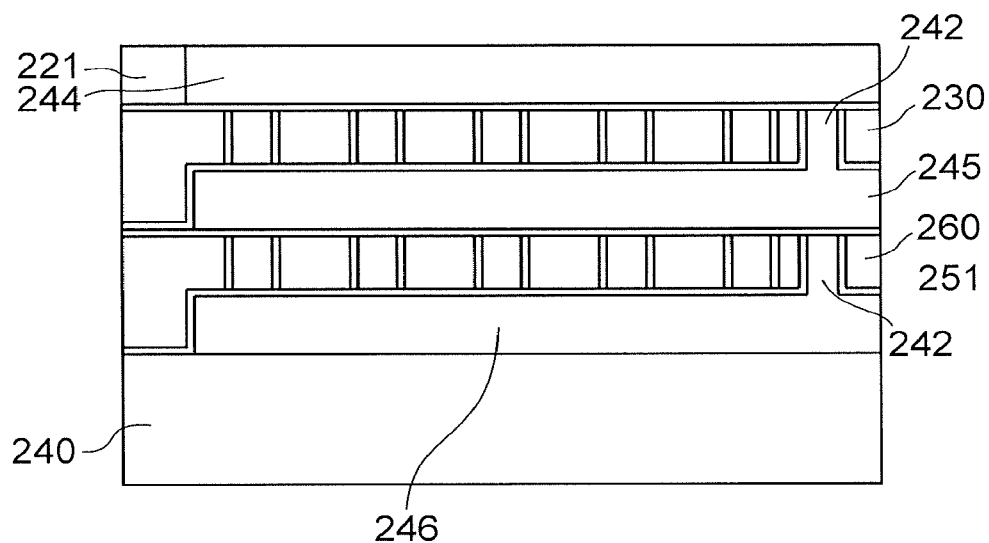
Figure 9I:
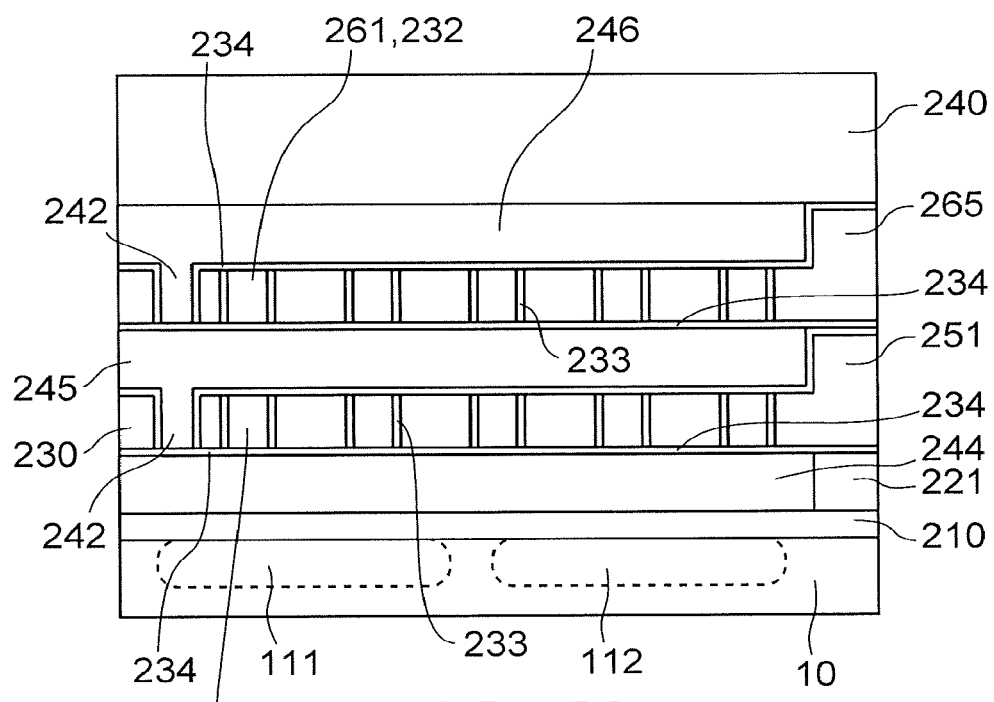
Figure 9J:
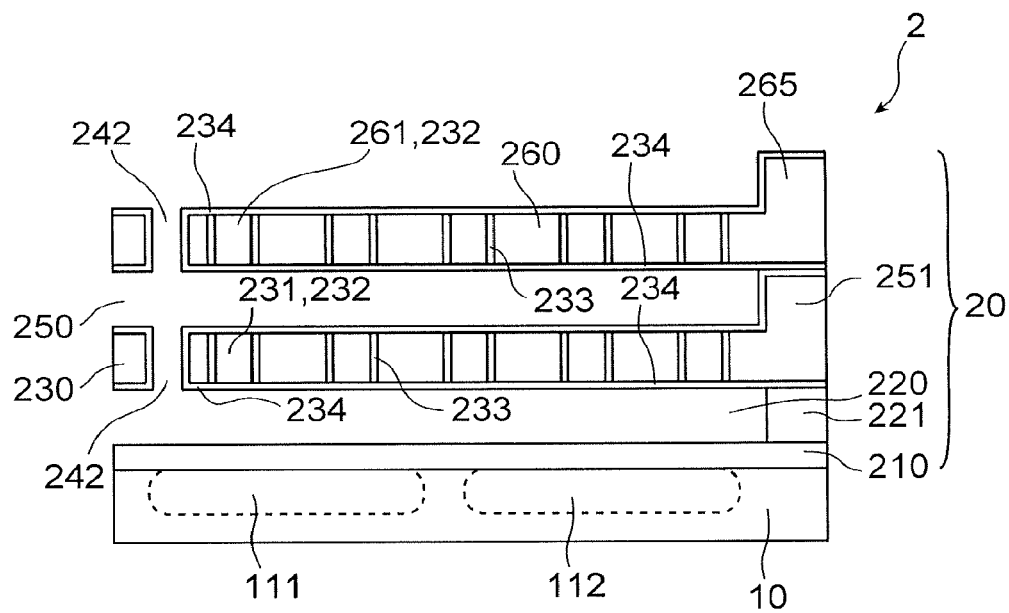

As such FIG. 9J shows a component 2 according to a fifth embodiment of the invention wherein the adaptation zone 220 is formed by a second hollow space, not by a layer as is the case for the component according to FIG. 8, and wherein, in a manner identical to the component shown in FIG. 7, the support 10 comprises the first and the second structure 111, 112.

In such a component 2, the first and the second metal layer 230 and 260 both comprise a piercing 242 in order to authorise the suppression of sacrificial layers 244, 245, such as shown in FIG. 9I, and allow for the forming of the first hollow space 250 and the adaptation zone 220. The adaptation zone 220, i.e. the second hollow space, and the first hollow space 250 include respectively a first and a second pillar 221, 251 each forming a support element. As such, the first pillar 221 makes it possible to maintain at a distance the first metal layer 230 from the substrate 10, while the second pillar 251 makes it possible to maintain at a distance the second metal layer 260 from the first metal layer 230.

Of course, although each one of the adaptation zone 220 and the first hollow space 250 has in FIG. 9J a single respective pillar 221, 251 for a surface corresponding to two structures 111, 112, other configurations can also be considered without leaving the scope of the invention. As such for example, it can also be considered to provide a different number of pillars for the adaptation zone 220 and the first hollow space 250 or to provide for each one a pillar for a surface corresponding to a structure 111, 112.

Also note that in this fifth embodiment, the component comprises a third pillar 265 protruding from the second metal layer 260. Such a third pillar 265, such as is described herein below, has for origin the method of manufacturing used to manufacture the component 2 according to this fifth embodiment. Such a third pillar 265, after manufacture of the component 2, does not have any particular function and it a step of suppression of such a third pillar 265 can then be provided.

Of course, according to a principle similar to the method for manufacturing a component 1 according to the third embodiment, it can also be considered to provide a method for manufacturing wherein such a third pillar 265 is not necessary.

FIGS. 9A to 9J show the main steps of manufacturing the component shown in FIG. 9J. Such a method of manufacture comprises the following steps:
supplying of a sacrificial substrate 240,
depositing of a first sacrificial layer 246, such as shown in FIG. 9A,
arranging in the first sacrificial layer 246 of an opening for the forming of the third pillar 221, such as shown in FIG. 9B,
formation of a first sacrificial pad in order to provide the piercing 242 of the second metal layer 260,
depositing of a layer of interface material 234 in contact with the first sacrificial layer 246, the sacrificial pad, and the sacrificial substrate 240 through the opening for the forming of the third pillar 271,
depositing of filling material 232 according to a conformation corresponding to the second through-holes of the second metal layer 260 according to a method similar to that shown in FIGS. 3B to 3C,
selective depositing of interface material 234 on the filling material 232 in such a way as to encapsulate the filling material 232, as shown in FIG. 9C,
depositing of a metal, such as copper in contact with the surface of the first interface layer in the spaces left free by the filling material 232 in order to form the second metal layer 230 and the third pillar 265,
depositing of a layer of interface material 134 in contact with the second metal layer and with the filling material flush with the second metal layer, such as shown in FIG. 9D,
depositing of a second sacrificial layer 245,
arranging in the second sacrificial layer 245 of an opening for the forming of the second pillar 251,
forming of a second sacrificial pad in order to provide the piercing 242 of the first metal layer 230,
depositing of a layer of interface material 234 in contact with the second sacrificial layer 245,
depositing of the filling material 232 according to a conformation corresponding to the first through-holes of the first metal layer 230 according to a method similar to that shown in FIGS. 3B to 3C, such as shown in FIG. 9E,
selective depositing of interface material 234 on the filling material 232 in such a way as to encapsulate the filling material 232,
depositing of the same metal as that used for the forming of the second metal layer 260 in contact with the surface of the second interface layer in the spaces left free by the filling material 232 in order to form the first metal layer 230 and the second pillar 251,
depositing of a layer of interface material 134 in contact with the second metal layer and with the filling material flush with the second metal layer, such as shown in FIG. 9F,
depositing of a third sacrificial layer 247
arranging in the third sacrificial layer 247 of an opening for the forming of the first pillar 221, such as shown in FIG. 9G,
depositing of the same metal as the one used for the forming of the second and of the first metal layer 260, 230 in order to form the first pillar 221,
supplying of a support 10 wherein a first and second structure 111, 112 are arranged,
fixing of the sacrificial substrate/sacrificial layers/metal layers unit on the support 10 by the third sacrificial layer 24 and the first pillar 221 and by means of a bonding layer 210, such as shown in FIG. 9I,
Suppression of the sacrificial substrate 240, of the first, second and third sacrificial layer here by passing through the piercings form by suppressing the sacrificial pads this in such a way as to form the hollow space corresponding to the adaptation zone 220 and the first hollow space 250, such as shown in FIG. 9J.

Figure 10:
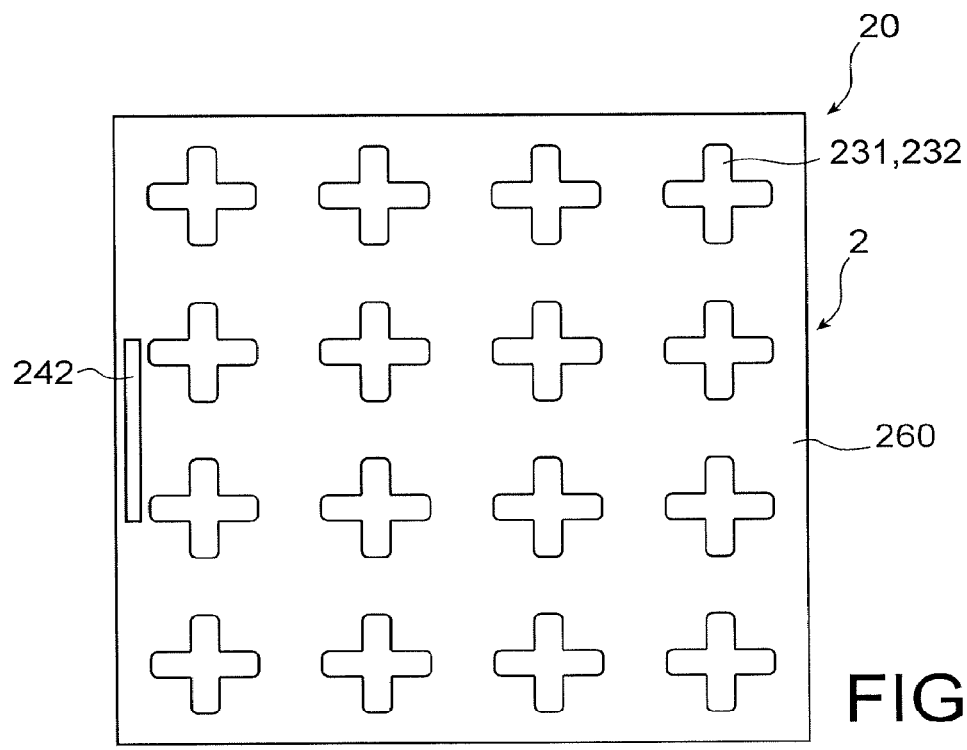
FIG. 10 shows a top view of a component such as shown in FIG. 9J, FIGS. 11A and 11B show the benefit of a separation of a first and a second metal layers formed by a hollow space instead of a layer of transparent material, with FIG. 11A showing the transmission spectra of components according to the invention wherein the hollow space has been replaced with a layer of silica and the figures showing the transmission spectra of components according to the invention, FIGS. 12A and 12B diagrammatically show the components of which the transmission spectra are respectively shown in FIG. 11A and FIG. 11B, FIG. 13 diagrammatically shows a component according to an alternative of the invention wherein the component comprises an optical filter comprising a first and a second portion wherein the filter is respectively a band-pass filter in a first and a second range of wavelengths, FIGS. 14A and 14B diagrammatically shows an example of practical implementation of a component of FIG. 1 adapted to enable a detection in four different wavelength ranges, FIG. 14A illustrating a schematic sectional view at the level of a first through-hole, FIG. 14B illustrating a top view of the shape of this same first through hole.

FIG. 10 shows a top view of a component 2 obtained during the implementation of a method for manufacturing such as described hereinabove. It can be observed that such a component 2, in addition to the presence of a second metal layer 260, is differentiated in that it has in addition to the second through-holes the piercing 242.

The step of depositing filling material 232 according to a conformation corresponding to the through-holes 231 of the first metal layer 230 can comprise the following sub-steps:
- depositing of a layer of photosensitive material, not shown, on the layer of the interface material 234 in contact with the second sacrificial layer 245,
- insulating and revealing of the layer of photosensitive material in such a way as to release zones of the layer of material 234 in contact with the second sacrificial layer, said zones corresponding to the first through-holes 231 of the first metal layer 230,
- depositing of the filling material 232 through the photosensitive layer in contact with the released zones of the layer of material 234 in contact with the second sacrificial layer,
- suppression of the layer of photosensitive material.

Alternatively, the step of depositing filling material 232 according to a conformation corresponding to the first through-holes of the first metal layer can also comprise the following sub-steps:
- depositing of a layer of filling material, not shown, in contact with the layer of interface material 234 in contact with the second sacrificial layer,
- depositing of a layer of photosensitive material in contact with the layer of filling material,
- insulating and revealing of the layer of photosensitive material in such a way as to protect only the zones of the layer of filling material corresponding to the first through-holes of the first metal layer 230,
- etching of the zones of the layer of filling material that are not protected,
- suppression of the layer of photosensitive material.

Of course such steps of depositing filling material 232 according to a conformation corresponding to the first through-holes can easily be adapted to be applied to the step of depositing filling material 232 according to a conformation corresponding to the second through-holes 261 of the second metal layer 260. This is all the more so true according to the invention the first and the second through-holes 231, 261 have a substantially identical conformation.

Figure 11A:
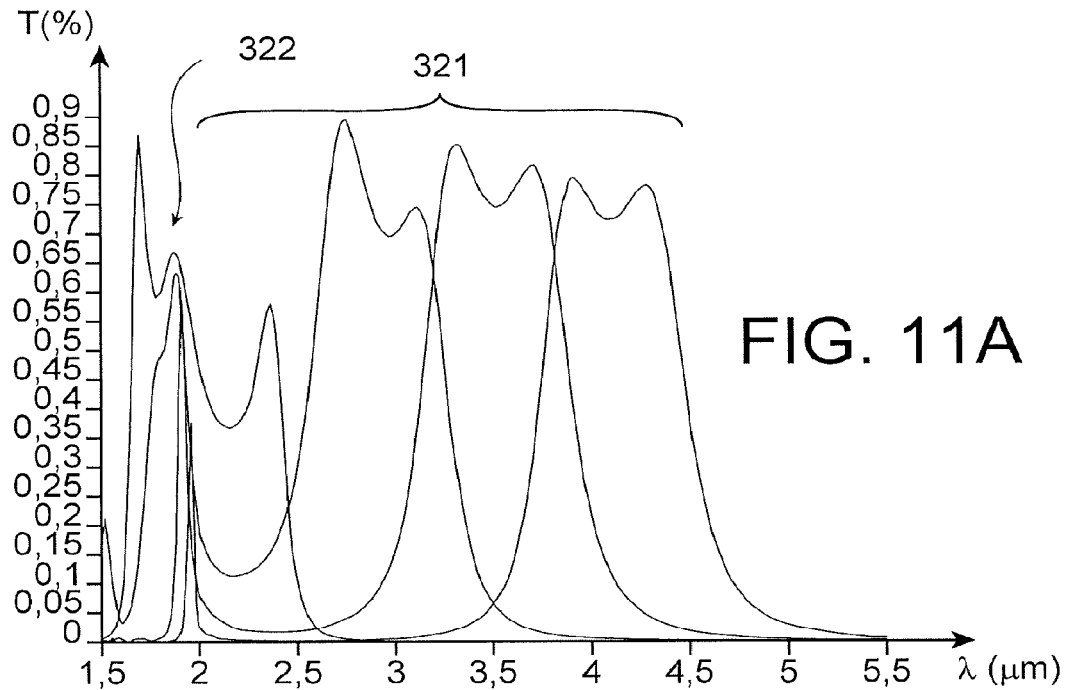
Figure 11B:
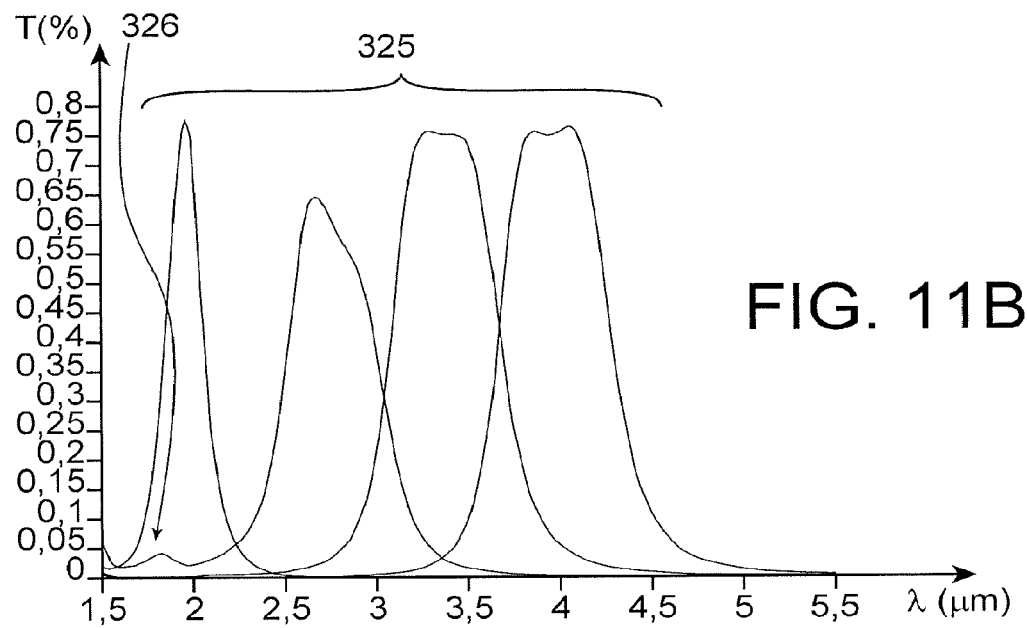

FIGS. 11A and 11B show respectively the variation of the transmission rate 321 of components s comprising a first and a second metal layer spaced by a metal inter-layer spacing zone made of silicon dioxide, and the variation of the transmission rate of a component according to the third embodiment of the invention, this for several configurations of the first and second through-holes in such a way as to show the benefit of the invention for several first wavelength ranges comprised in the infrared range.

As such, the variations in the transmission rate such as shown in FIG. 11A have been calculated for components having a configuration similar to that of a component according to the invention of which the adaptation zone 220 and the first hollow space 250 have been filled with a silicon dioxide.

Figure 12A:
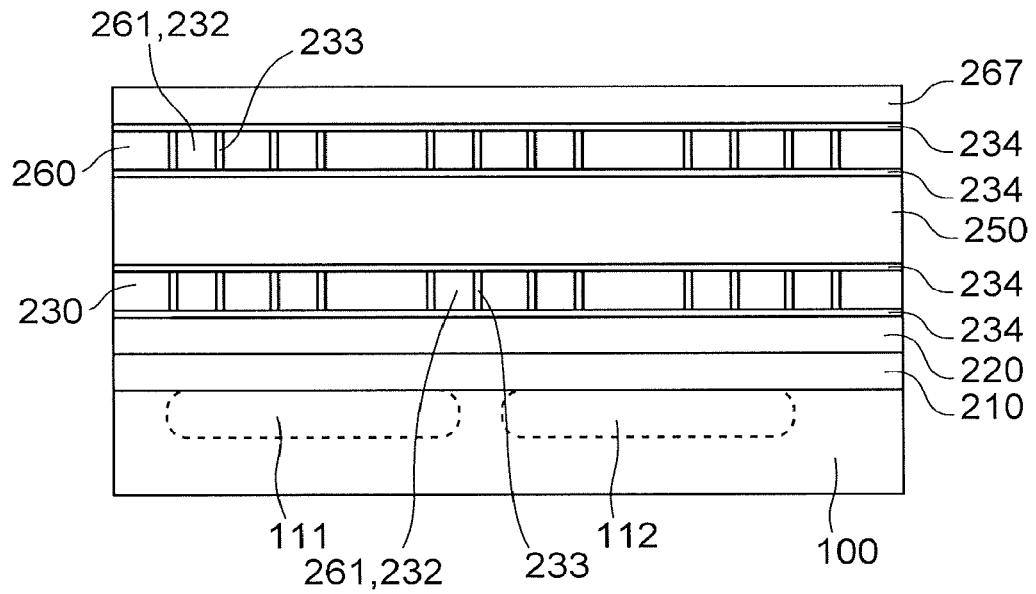
Figure 12B:
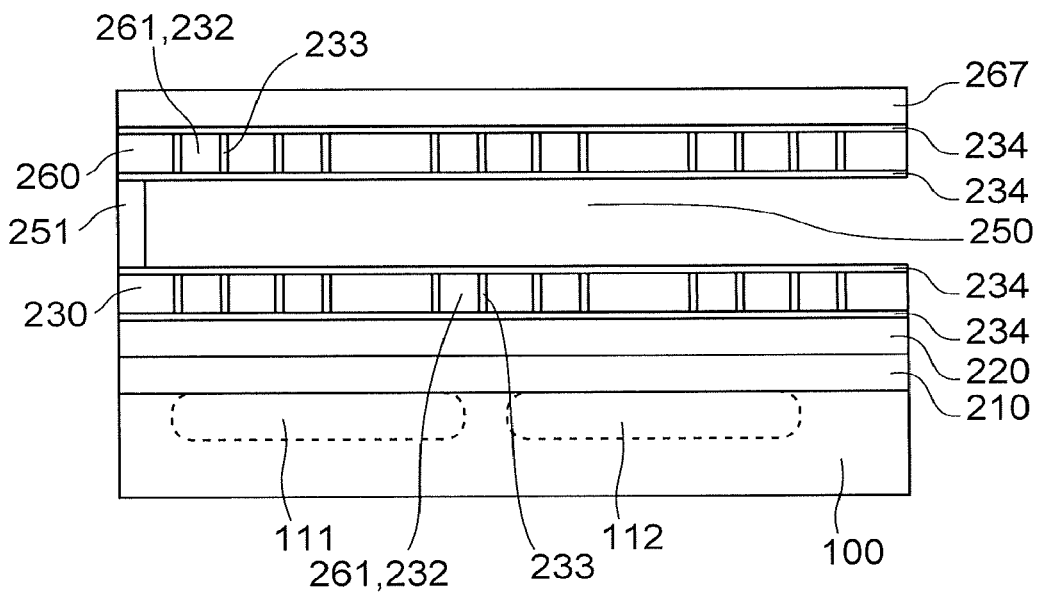

The configuration shared by the components according to the invention and those of which the transmission rates is shown in FIG. 11A is, in reference to FIGS. 12A and 12B, the following:
- each one of the components comprises starting from the reception face by going towards the incident medium, i.e. the support:
  - a passivation layer 267 made of silicon dioxide and 20 nm thick,
  - an interface layer 234 made of silicon nitride having a thickness of 20 nm,
  - a second metal layer 260 made of copper 100 nm thick,
  - an interface layer 234 made of silicon nitride having a thickness of 20 nm,
  - a metal inter-layer spacing zone, the latter being made of silicon dioxide for the components of which the transmission rates are shown in FIG. 11A and hollow, i.e. filled with air, for the components according to the invention,
  - an interface layer 234 made of silicon nitride having a thickness of 20 nm,
  - a first metal layer 239 made of copper 100 nm thick,
  - an interface layer 234 made of silicon nitride having a thickness of 20 nm,
  - an adaptation layer 220 made of silicon dioxide 200 nm thick,
  - a bonding layer 210 of 300 nm of which the optical index n is equal to 1.6,
  - the support, with the latter having been chosen with a refractive index n of 3.4.
- The pattern of the through-holes are rings such as shown in FIG. 2B,
- the values A of the through-holes of the components corresponding to the first, second, third and fourth curves are respectively equal to 800 nm, 700 nm, 420 nm and 800 nm,
- the values B of the through-holes of the components corresponding to the first, second, third and fourth curves are respectively equal to 460 nm, 0 nm, 0 nm and 300 nm,
- the network step according to which the through-holes are distributed in the first and the second metal layer is equal to the value A to which 300 nm was added,
- each one of the through-holes comprises silicon as a filling material and a spacing between the metal layer and the filling material of 20 nm, with this latter spacing 233 comprising silicon nitride as an interface material 234.

With regards to FIG. 10B, the structures according to the invention comprises a first hollow space 250 that separates the first and the second metal layer 230, 260 from one another by a distance d that satisfies the equality $$d = \frac{\lambda}{4}.$$

In can also be seen in FIG. 11A that such a conformation, the components comprising a metal inter-layer spacing zone made of silicon dioxide have all across the infrared range a rejection rate that is relatively substantial with regards to a component comprising a single first metal layer 230, with the exception of a transmission peak 232 centred around 2 μm. In the first wavelength range however, the transmission rate 231 does not exceeds, or exceeds by very little, 80% and is not constant over the entire first wavelength range. Note as such a relatively substantial drop in the transmission rates at the centre of the wavelength range.

For a component according to the invention, it can also be noted that the rejection rate is also substantial this without exception, with the variation in the transmission rate not having a transmission peak 236 outside of the first wavelength range. And furthermore the transmission rate 235 in the first range exceeds 80% for most of the components and has a more contained variation with respect to that observed for the components comprising metal inter-layer spacing zone made of silicon dioxide. As such a component according to the invention has a transmission rate 235 in the first optimised range of wavelengths while still retaining a substantial rejection rate observed for the components comprising metal inter-layer spacing zone made of silicon dioxide and this without exception, since no transmission peak is observed outside of the first wavelength range.

Figure 13:
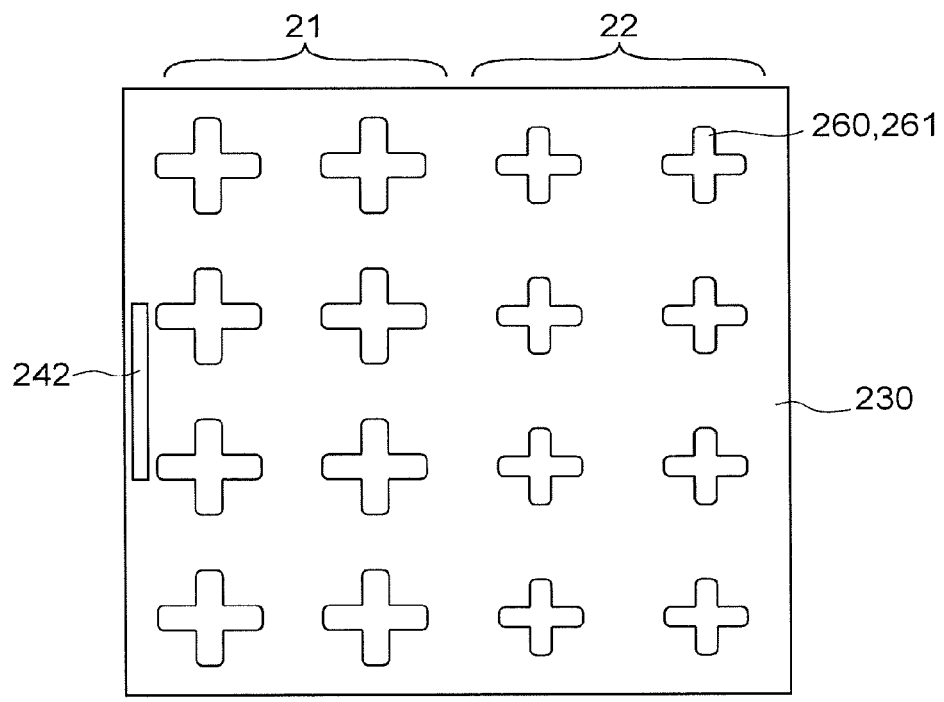

According to an alternative of the invention applicable to the components 2 according to the fourth and the fifth embodiment and in a manner similar to the component according to the second embodiment, the optical filter 20 can have, as shown in FIG. 13, a first portion 21 wherein the filter is a band-pass filter in the first range of wavelengths and a second portion 22 wherein the filter is a band-pass filter in a second range of wavelengths. A component 1 according to this alternative is differentiated from a component 1 according to the fourth embodiment and the fifth embodiment in that the first and second through-holes 231, 261 have on the first portion 21 of the optical filter 20 a first dimensioning and on a second portion of the filter 22 a second dimensioning corresponding respectively to the first and the second range of wavelengths.

The first and second through-holes 230, 261 are arranged in the first and the second portion 21, 22 of the first and second metal layer 230, 260 of the optical filter 20 according to a square network with a constant pitch. As such, the first and the second portion 21, 22 of the optical filter 20 can be distinguished only by the shape of the first and second through-holes 231, 261 that they contain. The dimensioning of the through-holes 231 of the first portion 11, in particular their maximum A and minimum B dimensions, is as such defined to correspond to the first range of wavelengths while the dimensioning of the first and second through-holes 231 of the second portion 22 is defined to correspond to the second range of wavelengths. In this way, it is mostly the portions of the electromagnetic radiation that are respectively in the first and the second wavelength range which are transmitted respectively to the first and to the second structure 111, 112.

Note of course that the first hollow space 250 makes it possible to separate the first and the second metal layer 230, 260 by the distance d by satisfying for each one of the first and of the second wavelength range the inequalities (1).

Figures 14A, 14B:
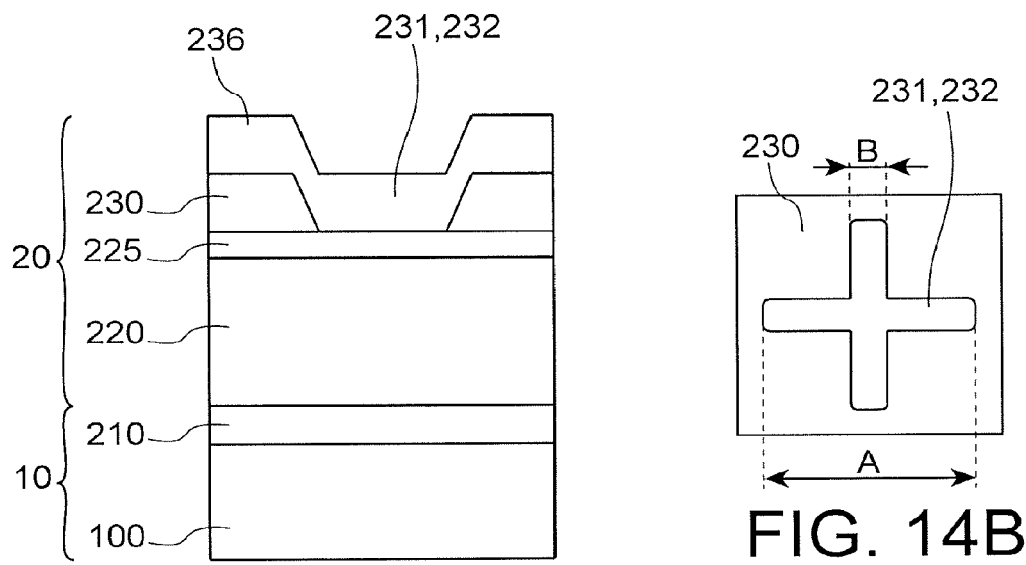

FIG. 14A schematically illustrates an example of practical implementation of a component 2 according to the first embodiment wherein the component 2 is intended for the detection and/or measurement of electromagnetic radiation in four wavelength ranges:

A first range of wavelengths between 2.5 and 2 µm,
A second range of wavelengths between 3.2 and 3.5 µm,
A third range of wavelengths between 3.5 and 4.3 µm, and
A fourth range of wavelengths between 4.5 and 4.8 µm.

FIG. 14A illustrates the configuration of the first through-holes of the metal layer 230 of such a component 2. Thus, as illustrated in FIG. 14A, such a component 2 comprises:
 a support 10 having the reception face 121 for receiving the electromagnetic radiation and at least a first, a second, a third and a fourth structure, not shown, each associated with a respective portion of the support,
 an optical filter 20 having, in combination with the structures, at least a first, a second, a third and a fourth portion, not shown, associated with respectively the first, the second, the third and the fourth structure, the optical filter 20 being arranged on the reception face 121 of the support 10 so as to filter the electromagnetic radiation transmitted to the support 10.

The support 10 comprises a semiconductor substrate 100 having at least a mercury cadmium telluride CdHgTe layer, not illustrated, in which are formed the first, the second, the third and the fourth structure. And the first, second, third and fourth structures are structures of the photodiode type, such as avalanche photodiodes, or photodetector barrier made of mercury cadmium telluride CdHgTe. The first, second, third and fourth structures have an arrangement of the matrix type in the substrate with a distance between two adjacent structures substantially equal to 15 microns.

The support 10 comprises, as illustrated in FIG. 14A, a passivation layer 110 passivating the surface of the substrate 100. Thus, the face of the passivation layer opposite the substrate 110 forms the reception face 121 of the support 10. The layer of passivation 110 has a thickness of 50 nm.

The optical filter 20 is in contact with the passivation layer being disposed on the receiving surface. The optical filter 20 comprises:
 an adaptation layer 210 forming adaptation zone made of silicon dioxide $SiO_2$ in contact with the reception face 121 of the support 10,
 an intermediate layer 225 of zinc sulphide ZnS into contact with the adaptation layer 210 on a face thereof which is opposite to the reception face 121,
 a metal layer 230 having a sub-bonding layer of titanium Ti, not shown, and a main sub-layer of gold Au, the metal layer 230 having a first, a second, a third and a fourth portion associated to respectively first, second, third and fourth portion of the optical filter 20, each of the first, second, third and fourth portion of the metal layer 230 having through holes 331 respectively dimensioned so that they form a frequency selective surface in respectively the first, the second, the third and the fourth range of wavelengths, each of the through holes containing zinc sulphide ZnS as filling material, the metal layer being in contact with the intermediate layer 225 on a face thereof which is opposite to the adaptation layer 220,
 a surface layer 236 of zinc sulphide ZnS covering the metal surface 230 on a face thereof which is opposite to the intermediate layer 225.

In this practical implementation, the optical filter 20 may be dimensioned as follows:
 the adaptation layer 220 has a thickness between 375 and 425 nm is preferably substantially equal to 400 nm,
 the intermediate layer 225 of zinc sulphide ZnS has a thickness between 35 and 65 nm being preferably substantially equal to 50 nm,
 the sub-layer of titanium grip has a thickness between 5 and 20 nm preferably being substantially equal to 20 nm,
 the main sublayer comprises gold Au has a thickness between 80 and 145 nm being preferably substantially equal to 130 nm,
 the surface layer 236 of zinc sulphide ZnS has a thickness between 35 and 65 nm being preferably substantially equal to 50 nm.

The first through holes 231 of the metal layer 230 are distributed in the layer in a two-dimensional hexagonal grating whose pitch is substantially equal to 400 nm. The through-holes 231, as illustrated in FIG. 14B, a cross shape. The dimensioning of the first through-holes in the first, second, third and fourth portions of the metal layer 230 may be as follows:
 in the first portion, A and B are respectively equal to 500 nm and 0, in the second portion, A and B are respectively equal to 1000 nm and 300 nm, in the third portion, A and B are respectively equal to 1100 nm and 400 nm, in the fourth portion, A and B are respectively equal to 1200 nm and 600 nm.

Figure 15:
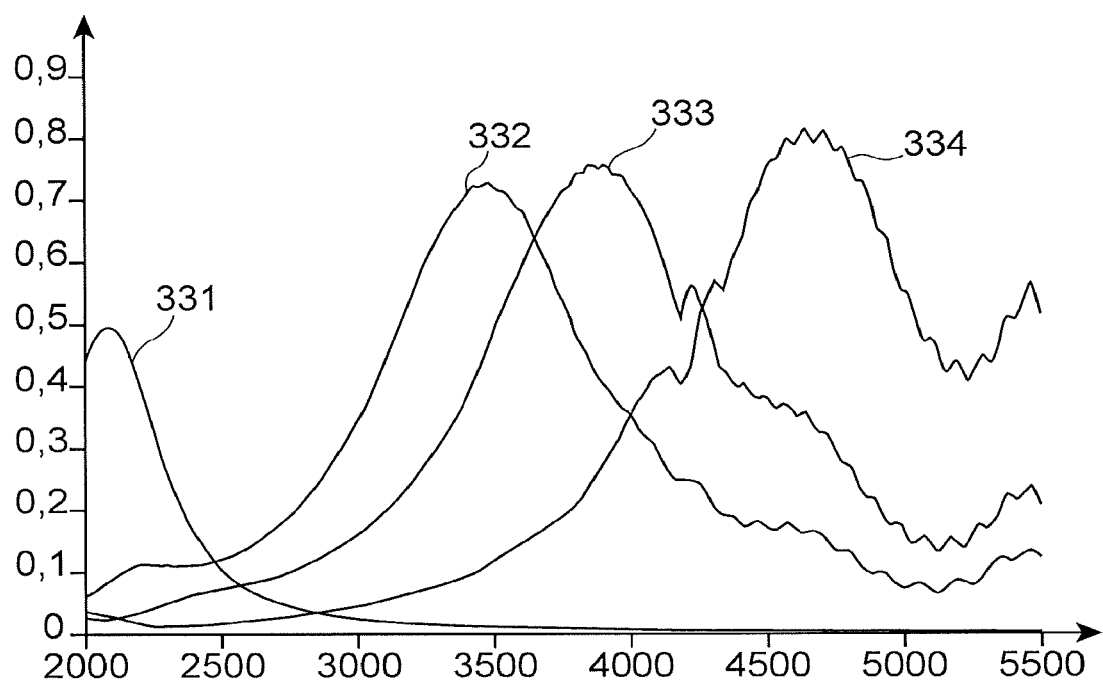
FIG. 15 illustrates transmission spectra calculated for different portions of an optical filter of a component according to the practical implementation illustrated in FIGS. 14A and 14B.

In this way and as shown in FIG. 15 which shows the transmission spectra 331, 332, 333, 334 calculated for respectively the first, second, third and fourth portions of the optical filter 20 of a component 2 according to this practical example. We can see that:

the first portion of the optical filter 20 enables a transmission of approximately 50% in the first range of wavelengths, as shown in the transmission spectrum 331, the second portion of the optical filter 20 enables a transmission of approximately 70% in the second range of wavelengths, as shown in the transmission spectrum 332, the third portion of the optical filter 20 enables a transmission of approximately 75% in the third range of wavelengths, as shown in the transmission spectrum 333, the fourth portion of the optical filter 20 enables a transmission of approximately 80% in the fourth range of wavelengths, as shown in the transmission spectrum 334.

It is therefore possible, with a component according to the invention, to obtain the detection of electromagnetic radiation in four wavelength ranges of infrared this only by adjusting the dimensioning of first through holes in each of the first, second, third and fourth portions of the optical filter 20.

It may be noted that, alternatively to this practical implementation, in the case where the component is intended for detecting electromagnetic radiation in the third and fourth wavelength range, the filling material 232 and the surface layer 236 can be made of germanium Ge. Thus, in this case the support 10, the optical filter 20 and the metal layer includes only the third and fourth portions according to this exemplary implementation. The sizing of holes passing through said third and fourth portion being adapted to this filling material 232 change.

Although in the embodiments and the practical implementation described hereinabove each one of the components 1 comprises at least a first and a second structure, the scope of the invention is not limited to only components comprising two structures. As such, the invention covers mono-structure components as well as components comprising a more substantial number of structures. A component according to the invention can therefore also have a hundred, even several thousand or several million structures without leaving the scope of the invention. The invention there is applies perfectly to the sensors of the photographic or video type which comprise structures organised in the form of a matrix.

It can also be noted that in accordance with the fifth embodiment, each one of the structures can be associated with a portion of the optical filter and therefore with a range of wavelengths that is proper to it. In this way it is possible with a single component to detect and/or measure the various portions of an electromagnetic radiation in ranges of wavelengths that are perfectly defined. This possibility is particularly advantageous since it allows for applications in spectroscopy and imaging with several ranges of wavelengths.

It can also be notes that although the invention aims more particularly for components comprising structures of the group comprising bolometers, photodiodes and barrier photodetectors, a component 1 according to the invention can also comprise a structure of another type which is able to absorb an electromagnetic radiation without leaving the scope of the invention.

Likewise, although in the first embodiment, the cover 120 makes it possible to encapsulate all the active surfaces of the first and the second structure, a component according to the invention can also comprise, without leaving the scope of the invention, one to several covers encapsulating individually each one of the structures.

The invention claimed is:

1. A component for detecting and/or measuring of a first electromagnetic radiation in a first range of wavelengths included in an infrared and visible range, the first range of wavelengths being centred around a wavelength $\lambda$, the component comprising:

a support comprising a reception face in order to receive the first electromagnetic radiation and at least one first structure to absorb the first electromagnetic radiation; and an optical filter of which at least one first portion associated with the first structure is of the band-pass fitter type in the first range of wavelengths, the optical filter being arranged on the reception face of the support in such a way as to filter the first electromagnetic radiation transmitted to the support, the optical filter comprising:

an adaptation zone covering at least partially the reception face of the support, the adaptation zone having a refractive index in the first range of wavelengths which is less than 2, and a first metal layer covering the adaptation zone and comprising first through-holes distributed and dimensioned so that the metal layer forms a frequency selective surface, wherein each one of the first through-holes contains a filling material of which the refractive index in the first range of wavelengths is greater than 2.

2. The component according to claim 1, wherein the first through-holes are regularly distributed in the first metal layer.

3. The component according to claim 1, wherein in each one of the first through-holes a spacing is provided between the metal layer and the filing material, the spacing being configured to have a refractive index in the first range of wavelengths less than 2 by containing an interface material having the refractive index.

4. The component according to claim 3, wherein the spacing is configured to have the refractive index in the first range of wavelengths less than 2 by containing the interface material, and wherein the interface material is also positioned between the filling material and the adaptation zone.

5. The component according to claim 3, wherein the spacing is configured to have the refractive index in the first range of wavelengths less than 2 by containing the interface material, and wherein the interface material is selected in a group comprising silicon dioxides silicon nitrides.

6. The component according to claim 1, wherein the adaptation zone is formed by a second hollow space.

7. The component according to claim 1, wherein the optical filter further comprises:

a second metal layer, said second metal layer comprising second through-holes according to a configuration that is substantially identical to the first through-holes of the first metal layer, with the second through-holes also containing the filling material, the first and the second metal layer being separated from one another by a distance d by a first hollow space, with the distance d satisfying the following inequalities:

$$\frac{\lambda}{6} \geq d \geq \frac{\lambda}{3}.$$

8. The component according to claim 7, wherein the distance d separating the first and the second metal layer is substantially equal to $$\frac{\lambda}{4}.$$

9. The component according to claim 1, wherein the filling material is a material selected in a group comprising silicon, germanium, zinc sulphide and lead telluride.

10. The component according to claim 1, wherein the component is adapted to furthermore detect a second electromagnetic radiation in a second range of wavelengths included in the infrared and visible range, the component comprising furthermore at least one second structure for the detection of the second electromagnetic radiation, the optical filter comprising at least one second portion associated Ti the second structure and the optical filter is of the band-pass filter type in the second range of wavelengths.

11. The component according to claim 1, wherein in each one of the first through-holes a spacing is provided between the metal layer and the filing material, the spacing being devoid of material.

12. A method for manufacturing a component for detecting of a first electromagnetic radiation in a first range of wavelengths included in an infrared and visible range, the first range of wavelengths being centred around a wavelength λ, the method comprising:

supplying of a support comprising at least one first structure configured to detect electromagnetic radiations and a reception face in order to receive the first electromagnetic radiation;

forming of an adaptation zone covering at least partially the reception face of the support and having a refractive index in the first range of wavelengths which is less than 2; and forming of a first metal layer covering the adaptation zone and comprising first through-holes distributed and dimensioned in order to form a frequency selective surface, with each one of the through-holes containing a filling material of which the refractive index in the first range of wavelengths is greater than 2.

13. The method of manufacturing according claim 12, wherein during the step of forming of the first metal layer, the first through-holes are regularly distributed in the first metal layer.

14. The method of manufacturing according to claim 12, wherein at least one of the steps of forming the first metal layer and a step of forming second metal layer comprises the following sub-steps:

depositing of the filling material in such a way as to delimit with the filling material at least partially the through-holes of the first or second metal layer, depositing of a layer of a metal material in such a way as to fill spaces left free by the filling material in order as such to form the first metal layer.

15. The method of manufacturing according to claim 14, wherein during the step of depositing of the filling material, the depositing is carried out in such a way that the filling material is surrounded by an interface material which defines, during the depositing of the metal material, a spacing between the first metal layer and the filling material.

16. A method for manufacturing a component for detecting of a first electromagnetic radiation in a first range of wavelengths included in an infrared and visible range, said first range of wavelengths being centred around a wavelength λ, the method comprising the following steps:

forming of a first metal layer, with the first metal layer comprising of the first through-holes distributed and dimensioned in order to form a frequency selective surface, with each one of the through-holes containing a filling material of which a refractive index in the first range of wavelengths is greater than 2;

forming of an adaptation zone on the first metal layer in such a way that the adaptation zone is covered by the first metal layer, the adaptation zone having a refractive index in the first range of wavelengths which s less than 2;

supplying of a support comprising at least one first structure to absorb the first electromagnetic radiation and a reception face in order to receive the first electromagnetic radiation or of a portion of the support for the forming of the support and comprising the reception face of the support;

transferring of the adaptation zone, the first metal layer and a sacrificial substrate on the reception face in such a way that the adaptation zone covers at least partially the reception face; and suppressing at least partially the sacrificial substrate.

* * * * *